(12) United States Patent
Habara et al.

(10) Patent No.: US 10,107,878 B2
(45) Date of Patent: Oct. 23, 2018

(54) MAGNETIC RESONANCE IMAGING APPARATUS AND ANTENNA DEVICE

(71) Applicant: HITACHI, LTD., Tokyo (JP)

(72) Inventors: Hideta Habara, Tokyo (JP); Yoshihisa Soutome, Tokyo (JP); Yosuke Otake, Tokyo (JP); Shinichiro Suzuki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 323 days.

(21) Appl. No.: 15/021,110

(22) PCT Filed: Sep. 4, 2014

(86) PCT No.: PCT/JP2014/073335
§ 371 (c)(1),
(2) Date: Mar. 10, 2016

(87) PCT Pub. No.: WO2015/056494
PCT Pub. Date: Apr. 23, 2015

(65) Prior Publication Data
US 2016/0216344 A1    Jul. 28, 2016

(30) Foreign Application Priority Data
Oct. 17, 2013 (JP) ................. 2013-216227

(51) Int. Cl.
*G01V 3/00* (2006.01)
*G01R 33/34* (2006.01)
(Continued)

(52) U.S. Cl.
CPC . *G01R 33/34076* (2013.01); *G01R 33/34007* (2013.01); *G01R 33/3453* (2013.01); *G01R 33/422* (2013.01)

(58) Field of Classification Search
CPC .............. G01R 33/3453; G01R 33/422; G01R 33/34076
(Continued)

(56) References Cited

U.S. PATENT DOCUMENTS 4,887,039 A * 12/1989 Roemer ........... G01R 33/34046
324/318
5,557,247 A    9/1996 Vaughn, Jr.
(Continued)

FOREIGN PATENT DOCUMENTS

| JP | 2008-35987 A | 2/2008 |
| WO | 2012/023385 A1 | 2/2012 |
| WO | 2013/065480 A1 | 5/2013 |

OTHER PUBLICATIONS

International Search Report from International Application No. PCT/JP2014/073335 dated Dec. 16, 2014.

*Primary Examiner* — Patrick Assouad
*Assistant Examiner* — Demetrius Pretlow
(74) *Attorney, Agent, or Firm* — Brundidge & Stanger, P.C.

(57) ABSTRACT

Provided is an antenna such as a TEM-type antenna and a microstrip-type antenna that has rung conductors and a shield conductor to electrically connect and use them. A holding member that maintains a shape of the shield conductor is composed by assembling ribs and thin walls. An inner holding member is a structural material. Holes are provided on at least either one of the shield conductor and the holding member adhered thereto or the inner holding member, which can adjoin conductors from the outside of the cylindrical antenna through the said holes during the antenna production.

11 Claims, 15 Drawing Sheets

(51) Int. Cl.
*G01R 33/345* (2006.01)
*G01R 33/422* (2006.01)

(58) Field of Classification Search
USPC .................................................. 324/300–322
See application file for complete search history.

(56) References Cited

U.S. PATENT DOCUMENTS

| | | | | |
|---|---|---|---|---|
| 5,581,186 A | * | 12/1996 | Keller | G01R 33/34046 |
| | | | | 324/318 |
| 9,759,788 B2 | * | 9/2017 | Eberler | G01R 33/36 |
| 2009/0099444 A1 | * | 4/2009 | Bogdanov | G01R 33/34046 |
| | | | | 600/422 |
| 2011/0121834 A1 | * | 5/2011 | Soutome | G01R 33/365 |
| | | | | 324/318 |
| 2014/0187909 A1 | * | 7/2014 | Saha | A61B 6/4417 |
| | | | | 600/411 |
| 2015/0102813 A1 | * | 4/2015 | Dumoulin | G01R 33/34 |
| | | | | 324/322 |
| 2015/0276898 A1 | * | 10/2015 | Findeklee | G01R 33/34046 |
| | | | | 324/309 |

* cited by examiner

FIG. 13
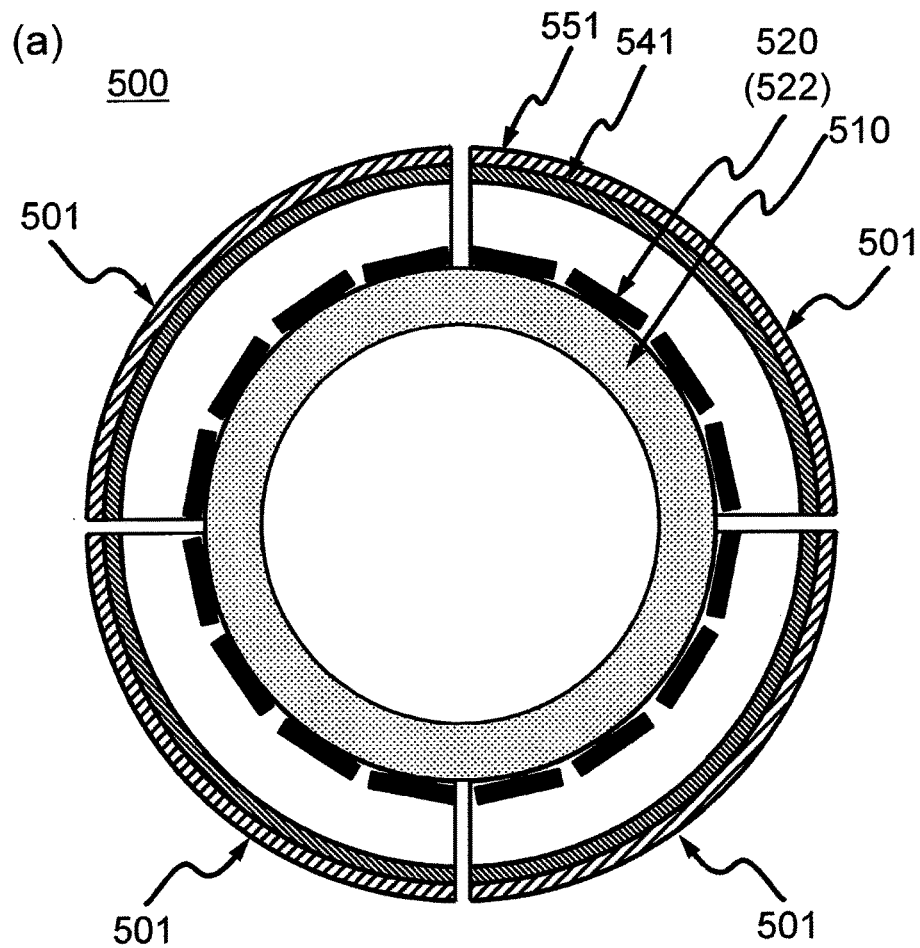
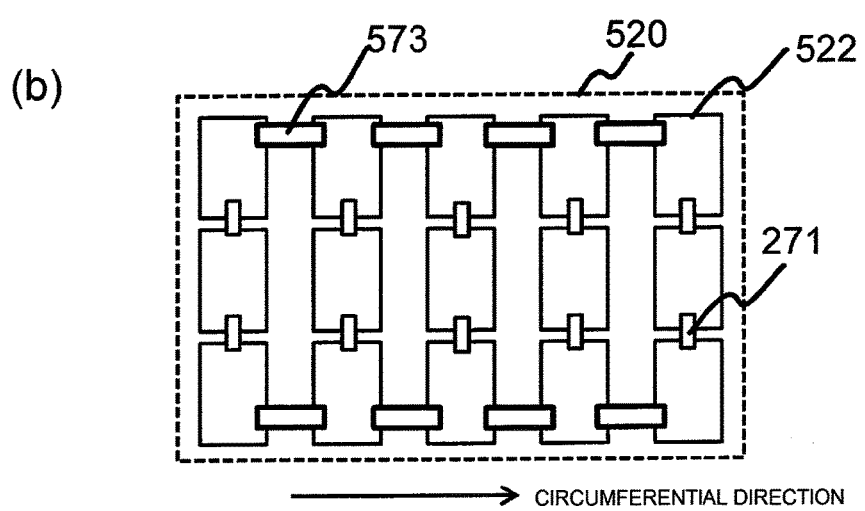
CIRCUMFERENTIAL DIRECTION

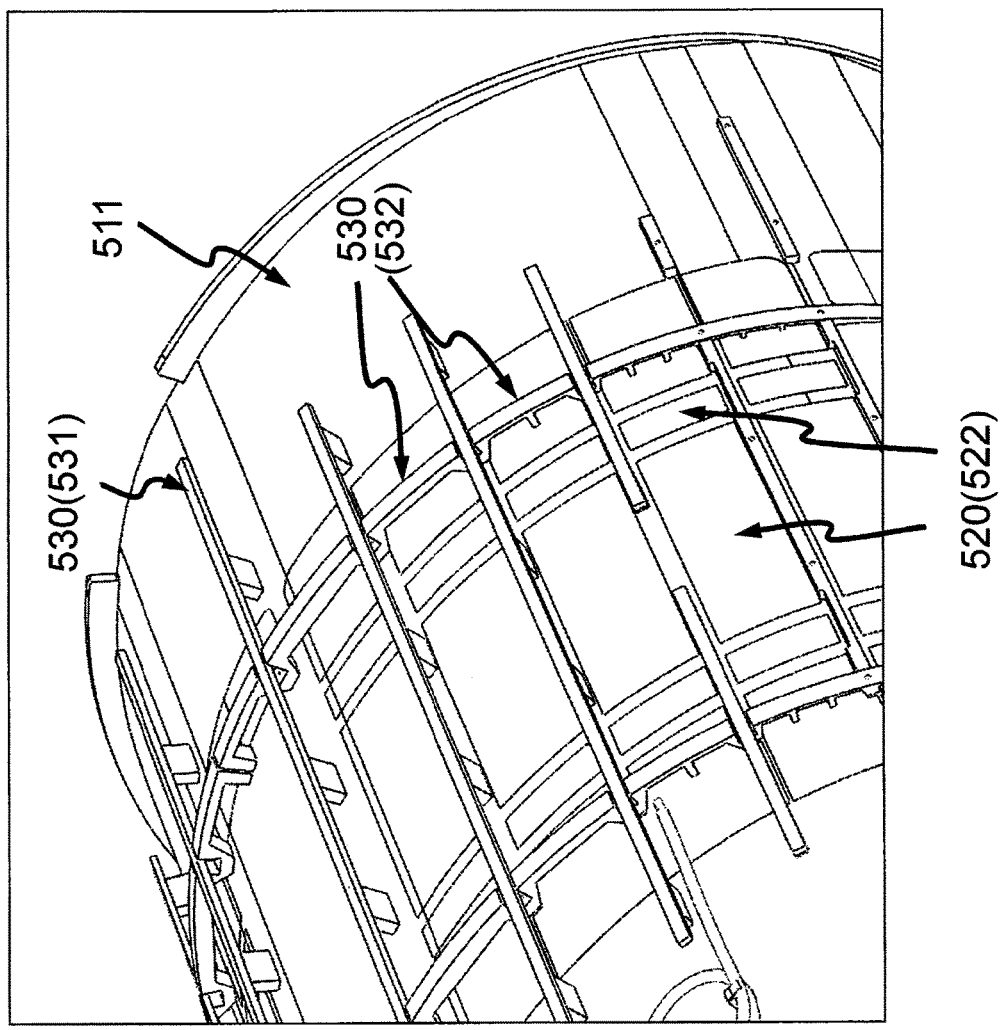

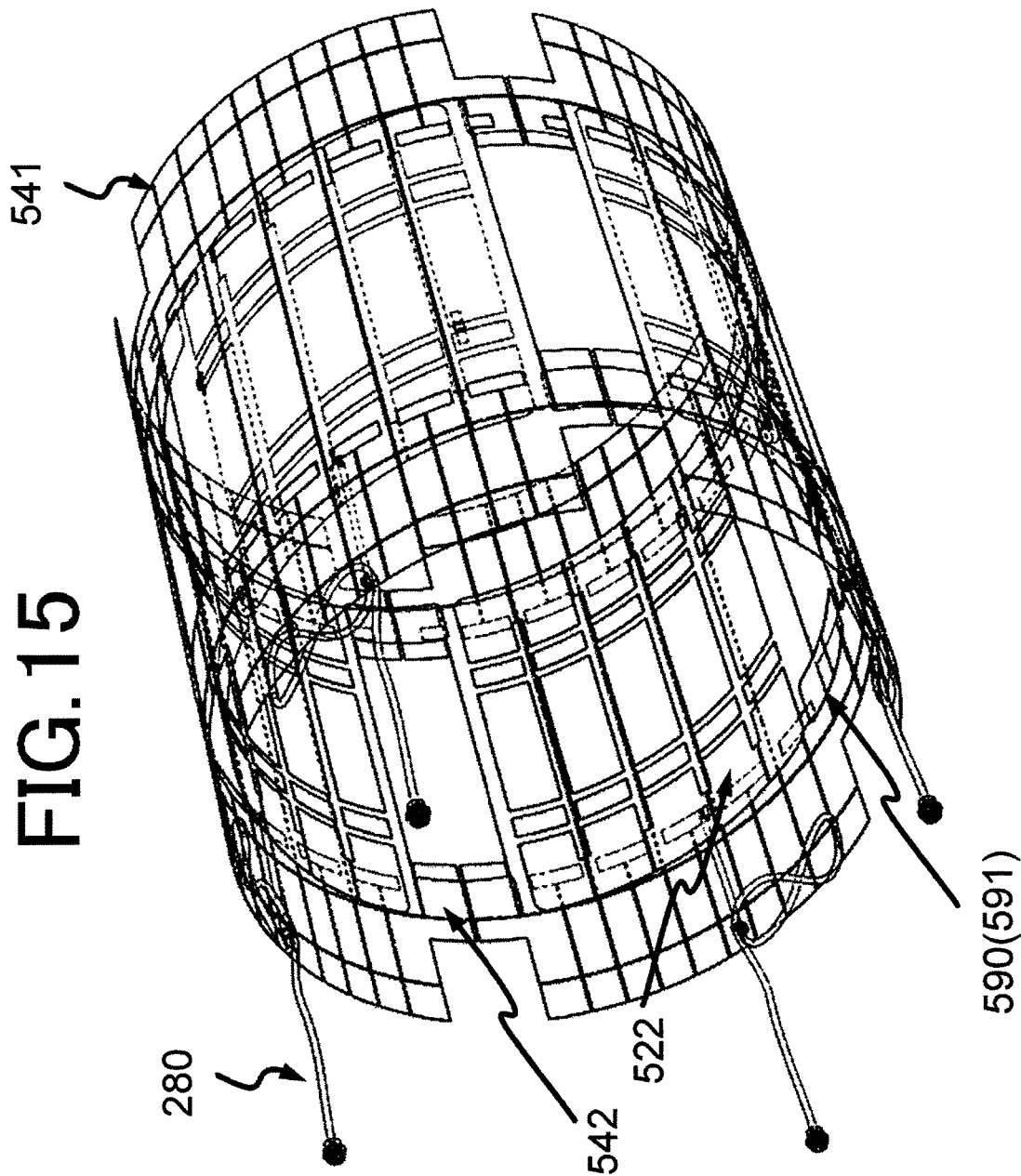

MAGNETIC RESONANCE IMAGING APPARATUS AND ANTENNA DEVICE

TECHNICAL FIELD

The present invention relates to a Magnetic Resonance Imaging (hereinafter, referred to as MRI) that measures a Nuclear Magnetic Resonance (hereinafter, referred to as NMR) signal from hydrogen, phosphorus, and the like in an object and images nuclear density distribution, relaxation time distribution, or the like technique and particularly to an antenna device that performs at least either one of transmitting a high-frequency signal or receiving an NMR signal.

BACKGROUND ART

An MRI apparatus images an object by irradiating a high-frequency signal that is an electromagnetic wave to the object placed in a homogeneous static magnetic field generated by a static magnetic field magnet in order to nuclear spins in the object and receiving a nuclear magnetic resonance signal that is an electromagnetic wave generated by the nuclear spins in order to process the signal. The high-frequency signal irradiation and nuclear magnetic resonance signal reception are performed an RF antenna that transmits or receives radio-frequency (RF) electromagnetic waves or an antenna device referred to as an RF coil (hereinafter, referred to as an RF antenna). Actual imaging requires a static magnetic field magnet, an RF antenna, and a gradient magnetic field coil that generates a spatially gradient magnetic field. The static magnetic field magnet, the gradient magnetic field coil, and the RF antenna have a cylindrical shape respectively in a tunnel-type MRI apparatus and are normally arranged in the above order from the outer side to the innermost side i.e., the object side.

A representative RF antenna used in the tunnel-type MRI apparatus is referred to as a cylindrical volume antenna. There are various types of cylindrical volume antennas referred to as a birdcage type, a TEM (Transverse Electromagnetic) type, and a microstrip-line type (for example, refer to PTL 1 and PTL 2). In such RF antennas, normally, approximately 16 to 32 bar-shaped conductors (rung conductors) referred to as rungs (crossbars or bars of a ladder) are arranged along the side surface and parallel to the central axis of the cylinder.

The TEM-type antenna and the microstrip-line-type antenna (hereinafter, there is also a case where they are generically referred to as a TEM-type antenna) are comprised of an inner cylindrical surface and an outer cylindrical surface, the rung conductors are attached to the inner cylindrical surface, and a shield conductor functioning as an installation surface is attached to the outer cylindrical surface. Then, each of the approximately 16 to 32 rung conductors described above and the shield conductor are electrically connected and used by coupling electric currents flowing in each rung conductor with each other.

CITATION LIST

Patent Literature

[PTL 1]: U.S. Pat. No. 5,557,247
[PTL 2]: International Publication No. WO2012/023385

SUMMARY OF INVENTION

Technical Problem

In order to improve the comfortableness during imaging, it is desired that an object placing space inside an MRI apparatus is as large as possible. However, high costs are required to manufacture a superconducting magnet and a gradient magnetic field coil comprising a tunnel-type MRI apparatus, and if these cylindrical inner diameters are enlarged, the costs are greatly increased. In order to improve the comfortableness of an object by expanding the object placing space under such a restriction, it is necessary to enlarge the inner diameter of an RF antenna as possible without changing the cylindrical outer diameter. This can be achieved by thinning thickness of the RF antenna.

However, it is required to provide a certain distance (gap) between rung conductors and a shield conductor in a TEM-type antenna in order to maintain the sensitivity. Therefore, when a difference between the inner and outer diameters is small, that is, when the thickness is thin, the antenna sensitivity is reduced. When the antenna sensitivity is reduced, a signal-to-noise ratio is reduced for a reception antenna, and the irradiation efficiency is reduced for an irradiation antenna.

Also, in order to prevent an RF antenna circuit from directly contacting an object and separate the object from a high electric field generated from the circuit as much as possible, the innermost cylindrical surface close to the object is required to have a certain thickness. It is thought that the thickness generally needs to be approximately 3 mm.

Since a shield conductor and a rung conductor of a birdcage-type antenna are not electrically connected, the birdcage-type antenna can be manufactured by reinforcing the structure of the cylindrical surface closest to an object and attaching the rung conductor to the outer cylindrical surface. However, since a shield conductor and a rung conductor of a TEM-type antenna are electrically connected and need to be integrally structured, they are installed between gradient magnetic field coils after producing the TEM-type antenna. At this time, since the shield conductor has a shape covering the outer cylindrical surface entirely, the outermost cylinder needs to be a sturdy structural body in light of the production procedure. Therefore, the outermost cylindrical surface is also required to have a thickness enough to function as a structural body. Also, since the TEM-type antenna is inserted between the gradient magnetic field coils after it is manufactured in an integral structure, a certain gap is also required between the gradient magnetic field coils.

Due to the above circumstances of the TEM-type antenna, it is necessary to select whether to sacrifice sensitivity by reducing a difference between the inner and outer diameters or comfortable usability and safety by reducing the inner radius.

The present invention was made in consideration of the above circumstances and has a purpose to provide a technique capable of achieving usability, safety, and sensitivity at the same time without greatly increasing the costs for an antenna with rung conductors and a shield conductor to be connected electrically, such as a TEM-type antenna and a microstrip-line type antenna.

Solution to Problem

The present invention is configured by combining a holding member maintaining a shape of a shield conductor with spacer members and a thin wall for an antenna with rung conductors and a shield conductor to be connected electrically, such as a TEM-type antenna and a microstrip-line type antenna. Also, an inner holding member is a structural material. Then, holes are provided on at least either one of the shield conductor and the holding member attached thereto or the inner holding member, which can adjoin conductors from the outside of the cylindrical antenna through the said holes during the antenna production.

Specifically, the magnetic resonance imaging apparatus of the present invention is provided with a cylindrical antenna device that performs at least either one of transmitting or receiving an electromagnetic wave at a certain frequency. The antenna device comprises a cylindrical inner structure holding member, a plurality of rung conductors extending to the axial direction of the inner structure holding member, a cylindrical shield conductor, and a cylindrical shield conductor holding member that holds the shield conductor in order from the inside toward the outside in the radial direction of the said antenna device. Between the inner structure holding member and the shield conductor, spacer members are arranged to form spaces between the rung conductors and the shield conductor. The plurality of rung conductors are arranged at certain intervals along the circumferential direction of the inner structure holding member on the outer circumferential surface of the said inner structure holding member. Both ends of the respective rung conductors in the axial direction are electrically connected to the shield conductor so that the said rung conductors and the said shield conductor form loop circuits. At least either one of the shield conductor and the shield conductor holding member or the inner structure holding member is provided with holes in the vicinities where the rung conductors and the shield conductor are electrically connected. Each of the loop circuits is adjusted so as to resonate at an electromagnetic wave frequency at which the said antenna device performs at least either one of transmission or reception. At least one of the loop circuits is provided with a power supply portion that performs at least either one of transmitting or receiving the electromagnetic wave.

Also, the magnetic resonance imaging apparatus of the present invention is provided with a cylindrical antenna device with a plurality of channels that performs at least either one of transmitting or receiving an electromagnetic wave at a certain frequency. The antenna device comprises a cylindrical inner structure holding member and segmented cylindrical single channel portions corresponding to the number of channels in order from the inside toward the outside in the radial direction. Each of the single channel portions comprises a plurality of segmental rung conductors extending to the axial direction of the antenna device, a segmented cylindrical shield conductor with a segmented cylindrical shape, and a segmented cylindrical shield conductor holding member with a segmented cylindrical shape that holds the segmented cylindrical shield conductors in order from the inside toward the outside in the radial direction. The single channel portions corresponding to the number of channels are arranged at certain intervals in the circumferential direction of the antenna device on the outer surface of the inner structure holding member. Between the inner structure holding member and the segmented cylindrical shield conductors, spacer members are arranged to form spaces between the segmental rung conductors and the segmented cylindrical shield conductors. The plurality of segmental rung conductors are arranged at certain intervals in the circumferential direction of the antenna device on the outer surface of the inner structure holding member. Both ends of the respective segmental rung conductors in the axial direction and the segmented cylindrical shield conductors are electrically connected so that the said segmental rung conductors and the said segmented cylindrical shield conductors form loop circuits. At least either one of the segmented cylindrical shield conductors and the segmented cylindrical shield conductor holding members or the inner structure holding member is provided with holes in the vicinities where the segmental rung conductors and the segmented cylindrical shield conductors are electrically connected. Each of the loop circuits is adjusted so as to resonate at an electromagnetic wave frequency at which the said antenna device performs at least either one of transmission or reception. Each of the segmented cylindrical shield conductors is provided with a power supply portion that performs at least either one of transmitting or receiving the electromagnetic wave.

Also, the antenna device of the present invention is a cylindrical antenna device that performs at least either one of transmitting or receiving an electromagnetic wave at a certain frequency and comprises a cylindrical inner structure holding member, a plurality of rung conductors extending to the axial direction of the inner structure holding member, a cylindrical shield conductor, and a cylindrical shield conductor holding member that holds the shield conductor in order from the inside toward the outside in the radial direction of the said antenna device. Between the inner structure holding member and the shield conductor, spacer members are arranged to form spaces between the rung conductors and the shield conductor. The plurality of rung conductors are arranged at certain intervals along the circumferential direction of the inner structure holding member on the outer circumferential surface of the said inner structure holding member. Both ends of the respective rung conductors in the axial direction are electrically connected to the shield conductor so that the said rung conductors and the said shield conductor form loop circuits. At least either one of the shield conductor and the shield conductor holding member or the inner structure holding member is provided with holes in the vicinities where the rung conductors and the shield conductor are electrically connected. Each of the loop circuits is adjusted so as to resonate at an electromagnetic wave frequency at which the said antenna device performs at least either one of transmission or reception. At least one of the loop circuits is provided with a power supply portion that performs at least either one of transmitting or receiving the electromagnetic wave.

Also, a production method of the antenna device of the present invention is characterized as follows. On the outer circumferential surface of a cylindrical inner structure holding member, rung conductors extending to the axial direction of the said inner structure holding member are attached. Capacitors are respectively connected to both ends of the rung conductors in the axial direction. At least one of power supply parts is fixed to the inner structure holding member. Spacer members are fixed to the outer circumferential surface of the inner structure holding member. A shield conductor is attached to the inner circumferential surface in advance, holes are provided on a cylindrical shield conductor holding member by double the number of the rung conductors, and then the spacer members are adhered to a surface on which the shield conductor was attached to the cylindrical shield conductor holding member. The respective capacitors are connected to the shield conductor in the vicinities of the holes, and the power supply parts are connected to the rung conductors and the shield conductor. The holes are provided in the vicinities where the capacitors connected to the rung conductors are arranged after the spacer members are adhered to the shield conductor holding member.

Advantageous Effects of Invention

According to the present invention, usability, safety, and sensitivity are compatible without greatly increasing the costs by using an antenna with rung conductors and a shield conductor to be connected electrically, such as a TEM-type antenna and a microstrip-line type antenna.

BRIEF DESCRIPTION OF DRAWINGS

FIG. 13(a) is an explanatory view for explaining configuration of the antenna device of the third embodiment, and FIG. 13(b) is an explanatory view for explaining rung conductors of the antenna device shown in FIG. 13(a).

FIG. 14 is an explanatory view for explaining configuration of the antenna device of the third embodiment FIG. 15 is an explanatory view for explaining a connection state of the antenna device of the third embodiment.

DESCRIPTION OF EMBODIMENTS

First Embodiment

Hereinafter, the first embodiment to which the present invention is applied will be described. In all the figures for explaining the embodiments of the present invention, the same reference signs are provided for the same functions, and the repeated explanations are omitted.

<MRI Apparatus Configuration>

Figure 1:
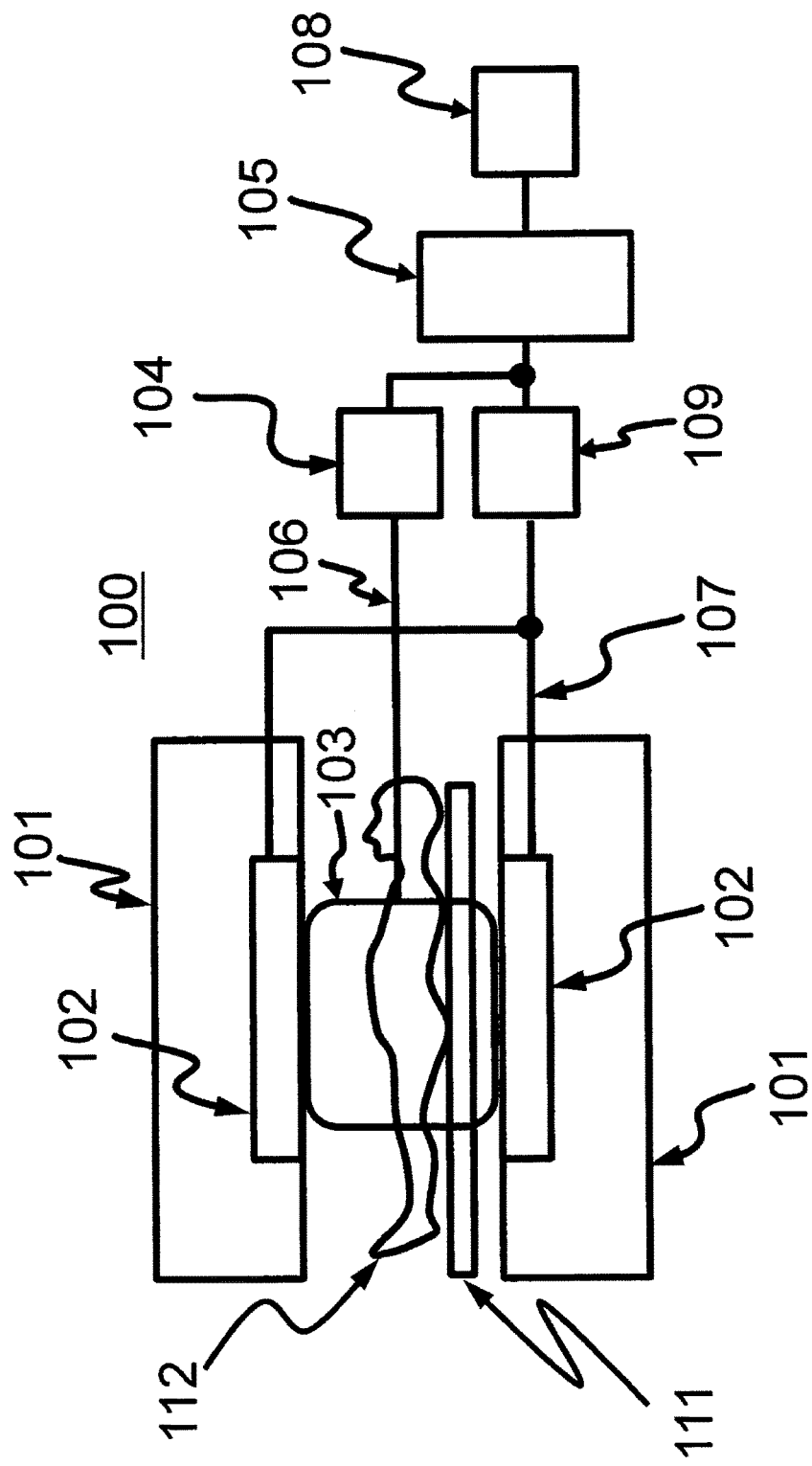
FIG. 1 is a schematic configuration view of the MRI apparatus of a first embodiment.

First, the configuration of the MRI apparatus of the present embodiment will be described. FIG. 1 is a schematic configuration view of the MRI apparatus 100 of the present embodiment. The MRI apparatus 100 comprises magnets 101 that form a static magnetic field in a measurement space in which an object 112 is placed, gradient magnetic field coils 102 that provide a magnetic gradient in a certain direction to the static magnetic field, an RF antenna 103 that transmits a high-frequency signal (RF signal) to the object 112 and receives a nuclear magnetic resonance signal (NMR signal) generated form the object 112, a transmitter receiver 104 that generates an RF signal to be transmitted from the RF antenna 103 for transmitting the signal to the RF antenna 103 and performs signal processing for the NMR signal received by the RF antenna 103, a gradient magnetic field power source 109 that supplies an electrical current to the gradient magnetic field coils 102, a data processing unit 105 that controls drive of the transmitter receiver 104 and the gradient magnetic field power source 109 and receives various information processes and operator's operation, a display device 108 for displaying process results of the data processing unit 105, and a bed 111 on which the object 112 is placed.

Additionally, the data processing unit 105 functions as an imaging unit that images internal information of the object 112 from an NMR signal that was received by the RF antenna 103 and for which the transmitter receiver 104 performed various signal processes.

The gradient magnetic field power source 109 is connected to the gradient magnetic field coils 102 with a gradient magnetic field control cable 107. Also, the RF antenna 103 and the transmitter receiver 104 are connected with a transmission/reception cable 106 that transmits and receives signals between the RF antenna 103 and the transmitter receiver 104. Although not shown in the figure, the transmitter receiver 104 is provided with a synthesizer, a power amplifier, a reception mixer, an analog/digital converter, a transmission/reception switch, and the like.

Types of the MRI apparatus 100 are divided into a horizontal magnetic field type and a vertical magnetic field type depending on the direction of a static magnetic field formed by the magnets 101. In case of the horizontal magnetic field type, the magnets 101 generally have cylindrical bores (central spaces), a static magnetic field in the horizontal direction is generated in FIG. 1, and this is referred to as a tunnel-type MRI apparatus. On the other hand, in case of the vertical magnetic field type, a pair of magnets is disposed at the upper and lower portions across an object, and a static magnetic field in the vertical direction is generated in FIG. 1. The present embodiment will be mainly described by taking a case of using a tunnel-type MRI apparatus of the horizontal magnetic field type having cylindrical bores as an example.

In the MRI apparatus 100 having the above configuration, the magnets 101, the gradient magnetic field coils 102, and the RF antenna 103 have a cylindrical shape as described above. Then, they are arranged in order of the magnets 101, the gradient magnetic field coils 102, and the RF antenna 103 from the outside. The object 112 lies on the bed 111 and is placed inside the RF antenna 103. The RF antenna 103, the gradient magnetic field coils 102, and the bed 111 are arranged in a static magnetic field space formed by the magnets 101.

A continuous RF signal and a continuous gradient magnetic field with intervals of a few milliseconds are respectively irradiated and applied to the object 112 placed in a static magnetic field by the RF antenna 103 and the gradient magnetic field coils 102. Also, the RF antenna 103 receives an NMR signal that resonates with the RF signal and is generated from the object 112, the transmitter receiver 104 and the data processing unit 105 performs signal processing, and then a magnetic resonance image is acquired. The object 112 is, for example, a predetermined site of a human body.

Additionally, a single RF antenna is shown as the RF antenna 103 that transmits an RF signal and receives an NMR signal in FIG. 1, but it is not limited to this. For example, by combining an RF antenna for wide-range imaging and that for local imaging or the like, an RF antenna comprised of a plurality of antennas may be used as the RF antenna 103. Also, unless otherwise distinction is needed, an RF signal transmitted by the RF antenna 103 and an NMR signal received by the RF antenna 103 are generically referred to as an electromagnetic wave.

In the present embodiment, an antenna device 200 (FIG. 3) that is a TEM-type antenna to be used by coupling a plurality of rung conductors and electric currents flowing in the said rung conductors with each other is used as the RF antenna 103.

Figure 2:
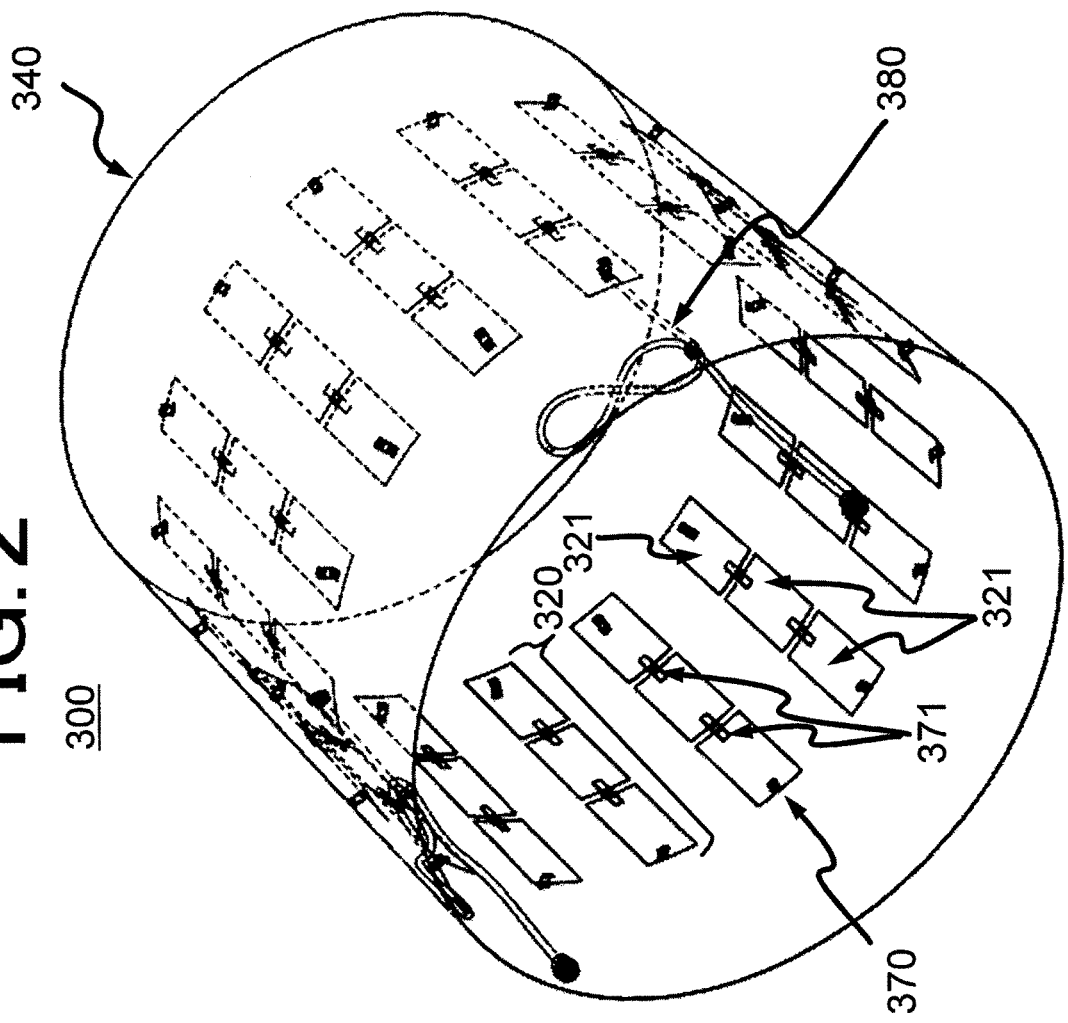
FIG. 2 is a perspective view of a conventional TEM-type antenna.

A simplest conventional TEM-type antenna will be described prior to describing the antenna device 200 of the present embodiment. FIG. 2 is a perspective view of an antenna device 300 that is a conventional TEM-type antenna to be used as the RF antenna 103. The antenna device 300 is disposed inside the gradient magnetic field coils 102 and has a cylindrical shape.

The antenna device 300 shown in FIG. 2 is a configuration example of the simplest TEM-type antenna. Although electrical parts such as a shield conductor and a rung conductor capacitor are illustrated, members supporting these parts spatially or the like are not illustrated.

As shown in the present figure, the antenna device 300 comprises a shield conductor 340 that serves as a cylindrical ground plane, a plurality of sets of rung conductors 320, and power supply parts 380 to be connected to two or four power supply portions. Also, each of the rung conductors 320 comprises a plurality of rung conductor strips 321, a shunt capacitor 370, and rung capacitors 371. As an example, FIG. 2 shows a case where 16 sets of the rung conductors 320 and two of the power supply parts 380 are included, in which each of the rung conductors 320 comprises three of the rung conductor strips 321.

As shown in FIG. 2, the antenna device 300 is entirely cylindrical. Additionally, the shield conductor 340 entirely covering the circumferential side surface of the cylinder is disposed on the outer circumferential portion of the cylinder that the antenna device 300 forms, parts such as the plurality of sets of rung conductors 320 and capacitors (the shunt capacitor 370 and the rung capacitors 371) are disposed inside the cylinder.

Although not shown in FIG. 2, the antenna device 300 comprises two coaxial cylindrical holding members. The inner one is referred to as an inner holding member, and the outer one is referred to as an outer holding member. The plurality of sets of rung conductors 320 are installed on the cylindrical inner holding member. Also, the shield conductor 340 is attached to the cylindrical outer holding member.

Here, the central axial direction of the cylinder of the antenna device 300 is referred to as the axial direction, a circumferential direction of the cross-sectional circle orthogonal to the central axis is referred to as the circumferential direction, and a diameter direction is referred to as the radial direction.

The plurality of the rung conductors 320 are arranged in the circumferential direction at certain intervals on the outer circumferential surface of the inner holding member.

Also, the rung conductors 320 are connected to the shield conductor 340 by the shunt capacitor 370 at both the ends in the axial direction. Hence, the respective rung conductors 320 and the shield conductor 340 are electrically connected, which forms a loop circuit. The electrical connection is normally achieved by soldering.

Also, a plurality of the rung conductor strips 321 comprising each of the rung conductors 320 are connected in series in the axial direction by the rung capacitors 371. Each of the rung conductor strips 321 is formed in a strip shape (a long narrow flat plate or a tape shape), a bar shape, or a cylindrical shape.

A TEM-type antenna achieved by the antenna device 300 is incorporated in the MRI apparatus 100 after the above respective components are integrally manufactured in advance. In order to manufacture the TEM-type antenna, the rung conductors 320 and the shield conductor 340 are soldered from the inside of the cylinder without contacting the outside of the shield conductor 340 that covers the entire circumferential surface.

In case of producing the MRI apparatus 100 to be used for not academic research purposes but general examinations in a hospital or the like, it is important to secure security and safety of a patient who is the object 112 to be placed inside the MRI apparatus 100. In order to achieve the above, a surface on the object 112 side of the RF antenna 103 (the antenna device 300) to be disposed closest to the object 112 i.e., the inner surface needs to be a cylindrical wall surface having a certain degree of thickness. Also, it is desirable that the inner surface of the antenna is integrally formed without holes and segments from the viewpoints of the appearance and the sturdiness.

Also, an antenna sensitivity of the TEM-type antenna depends on the distance between the shield conductor 340 and the rung conductor 320 that are two opposite conductors. The greater the distance between the shield conductor 340 and the rung conductor 320, the more the sensitivity is enhanced. However, in case of the TEM-type antenna, the distance tends to be shortened due to necessities of integral manufacture in advance and electrical connection as described above in comparison with a birdcage-type antenna.

Figure 3:
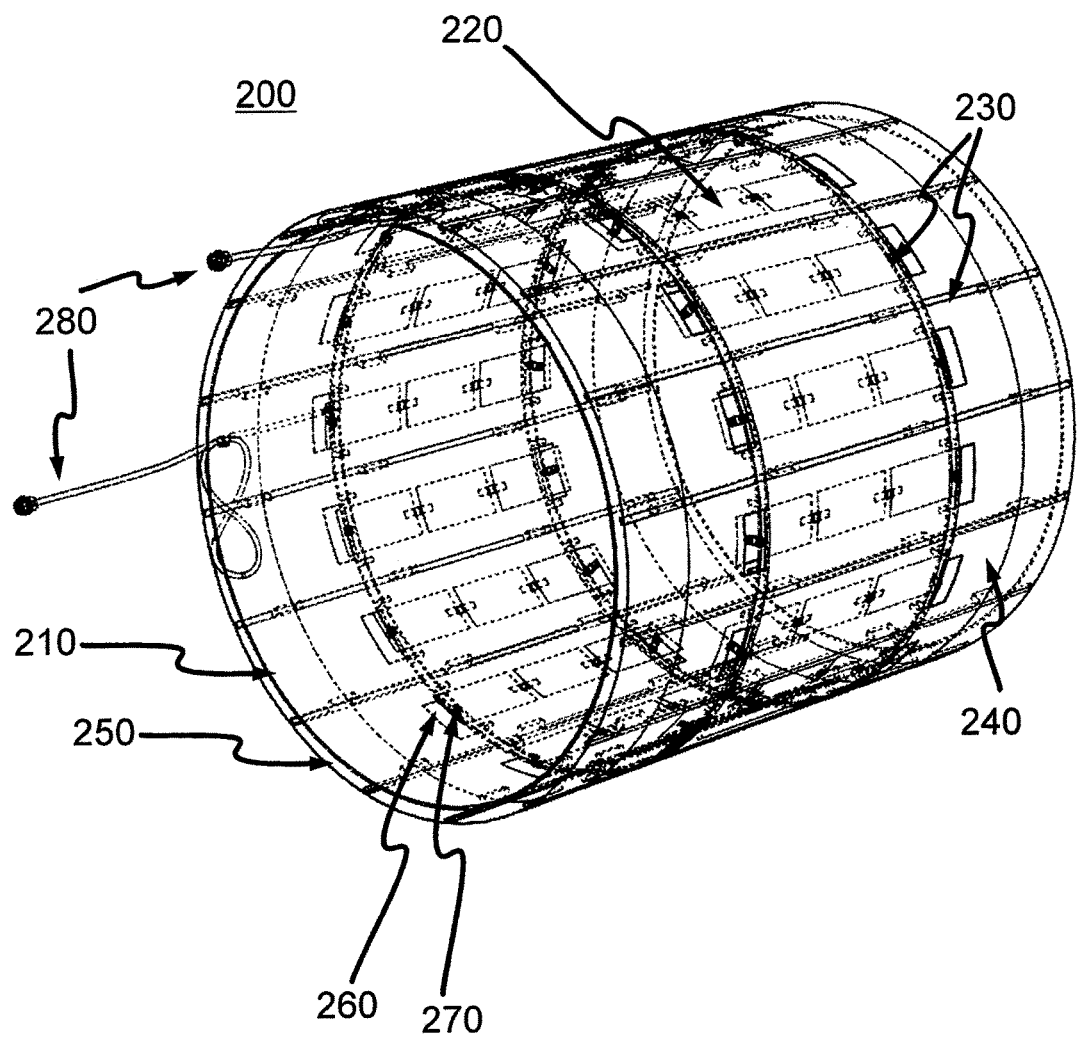
FIG. 3 is a perspective view of the antenna device of the first embodiment.

In the present embodiment, usability, safety, and sensitivity are achieved in a TEM-type antenna at the same time. The antenna device 200 that is the TEM-type antenna of the present embodiment will be described to achieve the above. Here, as the RF antenna 103, the antenna device 200 to be used as a volume antenna for the body trunk will be described as an example. FIG. 3 is a perspective view of the antenna device 200.

As shown in FIG. 3, the antenna device 200 of the present embodiment is a cylindrical device that performs at least either one of transmitting or receiving an electromagnetic wave at a predetermined frequency. Hereinafter, a case where the device is cylindrical will be described in the present embodiment. Also for the antenna device 200, the central axial direction of the antenna device 200 is referred to as the axial direction, a circumferential direction of the cross-sectional circle orthogonal to the central axis is referred to as the circumferential direction, and a diameter direction is referred to as the radial direction.

Figure 4:
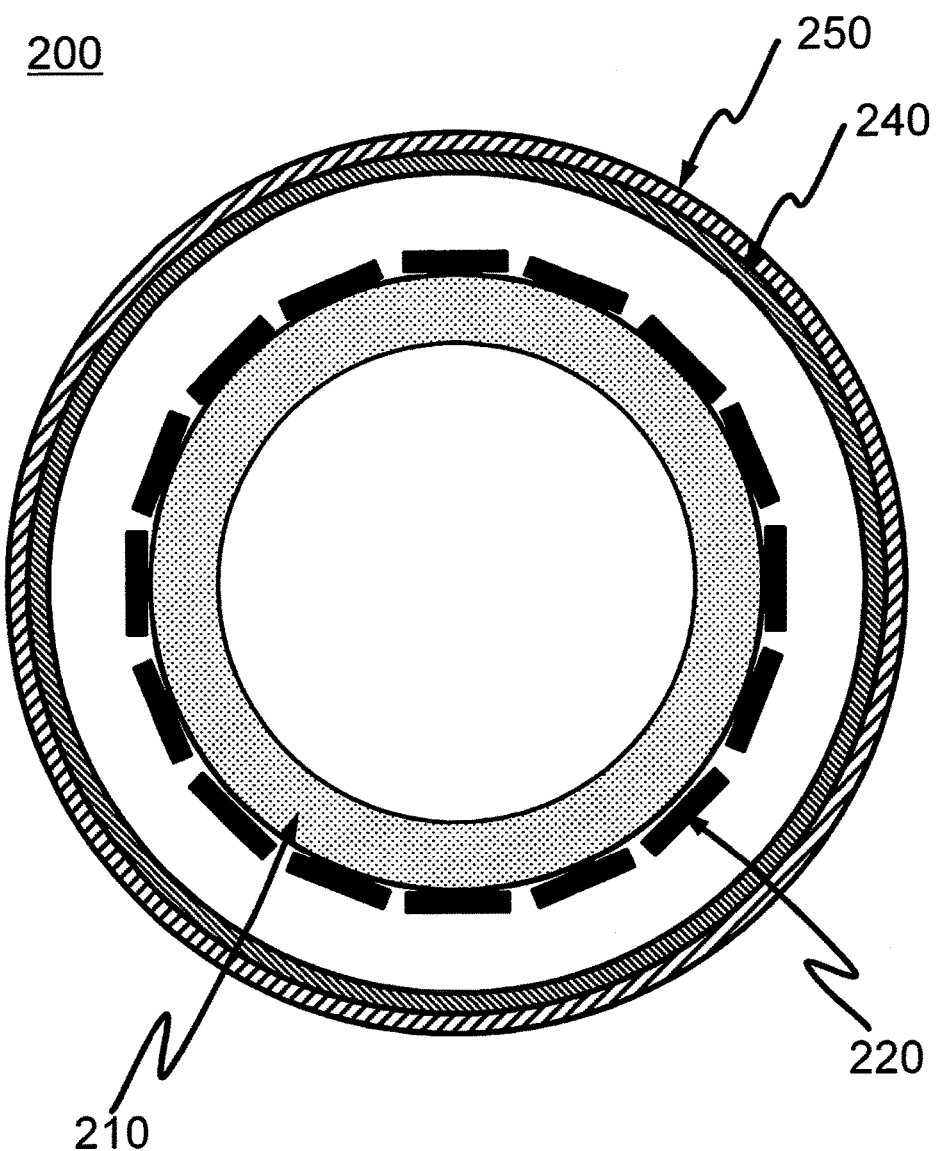
FIG. 4 is an explanatory view for explaining configuration of the antenna device of the first embodiment.

FIG. 3 is an external perspective view of the antenna device 200 of the present embodiment. Also, FIG. 4 is a cross-sectional view in a direction orthogonal to the central axis of the antenna device 200 of the present embodiment and an explanatory view for explaining the configuration. As shown in FIG. 4, the antenna device 200 of the present embodiment comprises a cylindrical inner structure holding member 210, a plurality of rung conductors 220 extending to the axial direction of the inner structure holding member 210, a cylindrical shield conductor 240, and a cylindrical shield conductor holding member 250 that holds the shield conductor 240 in order from the inside toward the outside in the radial direction.

Also, as shown in FIG. 3, spacer members (hereinafter, referred to as ribs) 230 that forms spaces between the rung conductors 220 and the shield conductor 240 are arranged between the inner structure holding member 210 and the shield conductor 240.

Although FIG. 3 shows a case where 16 sets of the rung conductors 220 are provided, the number is not limited. Also, although the antenna device 200 includes the other components, they will be described more detailed using FIGS. 5, 6, 7, and 8. Furthermore, the ribs 230 are not illustrated in FIG. 4.

Also, a plurality of the rung conductors 220 are arranged at certain intervals along the circumferential direction of the inner structure holding member on the outer circumferential surface of the said inner structure holding member 210, both ends of the respective rung conductors 220 in the axial direction and the shield conductor 240 are electrically connected so that the rung conductors 220 and the shield conductor 240 form loop circuits, at least either one of the shield conductor 240 and the shield conductor holding member 250 or the inner structure holding member 210 is provided with holes 260 in the vicinities where the rung conductors 220 and the shield conductor 240 are electrically connected, and each of the loop circuits is adjusted so as to resonate at an electromagnetic wave frequency at which the antenna device 200 performs at least either one of transmission or reception.

The electrical connection is made by, for example, connecting a capacitor (shunt capacitor) 270 between the shield conductor 240 and the rung conductors 220. That is, the loop circuits include the shunt capacitors 270, and a resonant frequency of the loop circuit is adjusted by the shunt capacitor 270. Therefore, a capacity of the shunt capacitors 270 is adjusted so that the loop circuits resonate at a frequency of an electromagnetic wave transmitted and received by the antenna device 200.

Additionally, at least one of the loop circuits is connected to power supply parts 280 that perform at least either one of transmitting or receiving an electromagnetic wave. Although FIG. 3 shows a case where two power supply points for connecting the power supply parts 280 are provided, the number is not limited.

<Inner Structure Holding Member>

The inner structure holding member 210 is a structural member disposed on the side closest to the object 112. The inner structure holding member 210 is made of, for example, glass fiber reinforced plastic or the like with a certain thickness such as 3 mm. In the present embodiment, the inner structure holding member 210 is provided with functions including a shape holding function, a flame retardancy retaining function, and a function to prevent the object 112 from contacting electrical parts electrically and thermally. Therefore, the thickness is increased by the shield conductor holding member 250.

<Shield Conductor Holding Member>

The shield conductor holding member 250 is made of, for example, a relatively thin material such as glass epoxy resin with a thickness of 0.5 mm.

In the present embodiment, the central axis of the gradient magnetic field coils 102 is the same as that of the inner structure holding member 210 and the shield conductor holding member 250. In the present embodiment, the antenna device 200, the inner structure holding member 210, and the shield conductor holding member 250 have coaxial cylindrical shapes. Furthermore, an inner diameter of the inner structure holding member 210 is set smaller than that of the shield conductor holding member 250, and the inner structure holding member 210 is disposed inside the shield conductor holding member 250.

<Rung Conductor>

Figure 5:
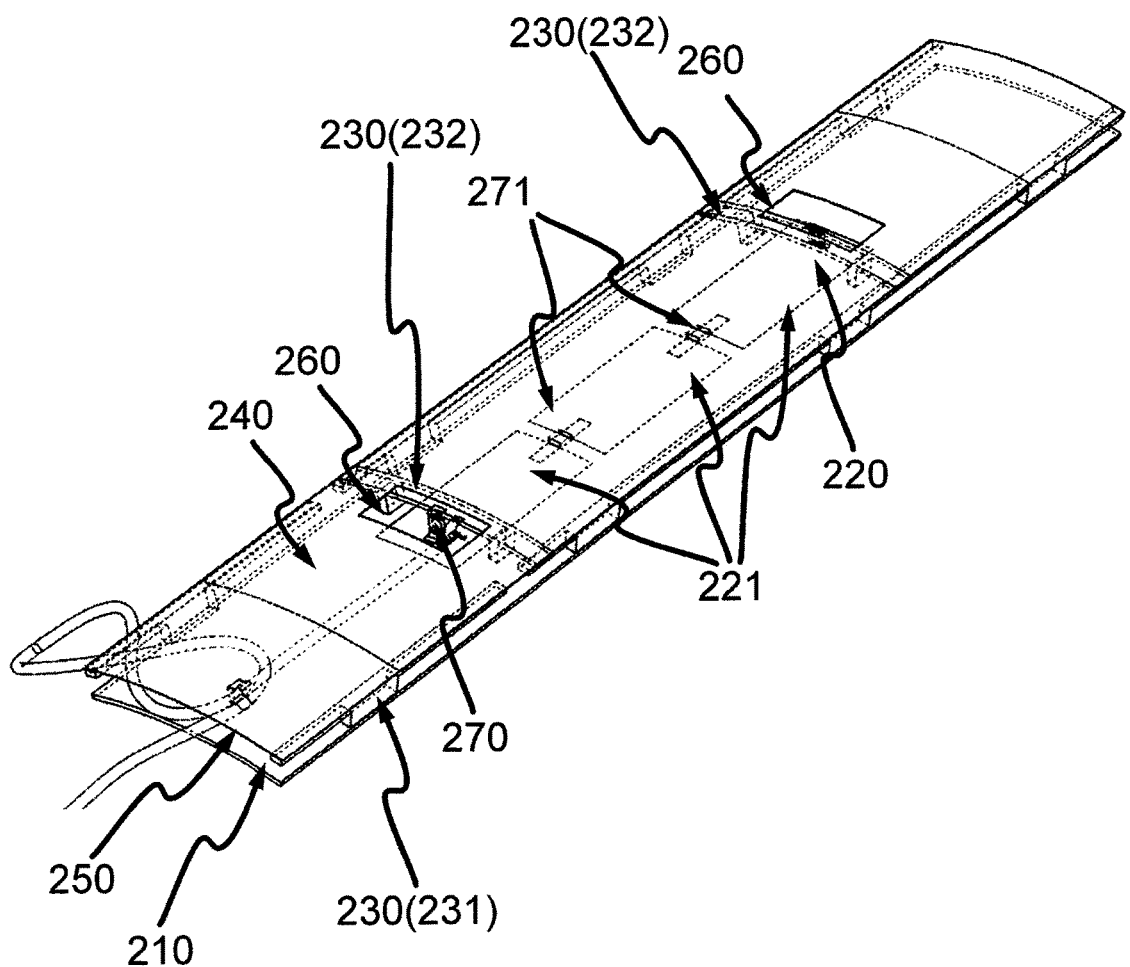
FIG. 5 is an explanatory view for explaining configuration of the antenna device of the first embodiment.

The rung conductor 220 has a similar configuration to the rung conductor 320 of the antenna device 300 that is basically a conventional TEM-type antenna. FIG. 5 is an enlarged view where a part of one of the rung conductors 220 in FIG. 3 is cut out. As shown in the present figure, a plurality of the rung conductor strips 221 and a plurality of the capacitors (rung capacitors) 271 are provided.

Each of the rung conductor strips 221 is made with a conductor formed in a strip shape (a long narrow flat plate or a tape shape), a bar shape, or a cylindrical shape. A plurality of the rung conductor strips 221 comprising each of the rung conductors 220 are connected in series in the axial direction by the rung capacitors 271. That is, each of the rung conductors 220 is divided into a plurality of the rung conductor strips 221 in the axial direction, and each of the rung conductor strips 221 is connected to a rung conductor strip adjacent in the axial direction by the rung capacitors 271.

In the present embodiment, a loop circuit is interrupted by dividing the rung conductor 220 into a plurality of the rung conductor strips 221 in the axial direction. Hence, a resonant frequency of the loop circuit can be adjusted using not only the shunt capacitor 270 but also the rung capacitors 271.

Each capacitor and each conductor are electrically connected by soldering or the like. Capacities of these capacitors (the shunt capacitor 270 and the rung capacitors 271) are adjusted so that he rung conductors 220 and the shield conductor 240 compose the loop circuits resonating at a frequency of an electromagnetic wave transmitted and received by the antenna device 200. Hence, the antenna device 200 of the present embodiment resonates at a frequency of a signal transmitted and received by the RF antenna 103 and achieves a function as an antenna that performs at least either one of transmission or reception.

Although FIG. 5 shows a case where there are three of the rung conductor strips 221 to which two of the rung capacitors 271 are connected, these numbers are not limited. For example, the numbers of the rung conductor strips 221 and the rung capacitors 271 may be respectively 1 and 0. When the numbers of the rung conductor strips 221 and the rung capacitors 271 are large (the number of serial connections is large), voltages at both ends of the rung conductor 220 can be advantageously reduced.

The shunt capacitors 270 are connected one by one to each end of the rung conductors 220 in the axial direction and are connected to the shield conductor 240. A plurality, such as two or five, of the shunt capacitors 270 may be arranged in parallel at each end.

Also, although the rung capacitors 271 are respectively arranged in each gap between three of the rung conductor strips 221 in FIG. 5, a plurality, such as two or five, of the rung capacitors 271 may be arranged in parallel in each gap.

Also, a plurality of sets of the rung conductors 220 are arranged at certain intervals in the circumferential direction on the outer circumferential surface of the inner structure holding member 210. At this time, the arrangement is set so that the longitudinal direction is approximately parallel to the axial direction. Consequently, the rung conductors 220 adjacent to each other are approximately parallel. Each of the rung conductors 220 is attached using a double sided tape or the like so as to adhere to the outer circumferential surface of the inner structure holding member 210. Additionally, the number of the rung conductors 220 is generally 16 to 32.

Additionally, the rung conductors 220 are made of copper foil or the like with a thickness of 10 or more microns. Although the present embodiment shows a case of a strip shape (a long narrow flat plate or a tape shape), the rung conductors may be formed in a bar shape or a cylinder shape.

<Shield Conductor>

The shield conductor 240 is attached to the inner circumferential surface of the shield conductor holding member 250. The shield conductor 240 is adhered to the entire inner surface of the cylindrical shield conductor holding member 250 and has a cylindrical shape. In order to function as a TEM-type antenna, the shield conductor 240 needs to continuously cover the entire cylindrical surface formed by the antenna device 200 so that electromagnetic waves at a frequency for transmitting and receiving as an antenna do not leak out of the shield. Therefore, the shield conductor 240 almost covers the cylindrical inner surface of the shield conductor holding member 250. However, it is desirable that the length in the axial direction is equivalent to or longer than that of a rung conductor in the axial direction, and the length of the shield conductor may be shorter than that of the shield conductor holding member 250.

Similarly to the rung conductors 220, the shield conductor 240 is also made of copper foil or the like with a thickness of 10 or more microns.

<Spacer Member>

The spacer members (ribs) 230 are disposed between the inner structure holding member 210 and the shield conductor holding member 250 in order to form spaces (gaps) between both the members and stably hold the gaps. As described above, the rung conductors 220 are installed on the inner structure holding member 210, and the shield conductor 240 is attached to the shield conductor holding member 250. Therefore, the gaps between both the members are gaps between the rung conductors 220 and the shield conductor 240 and determine sensitivity of the antenna device 200 as described above.

Figure 6:
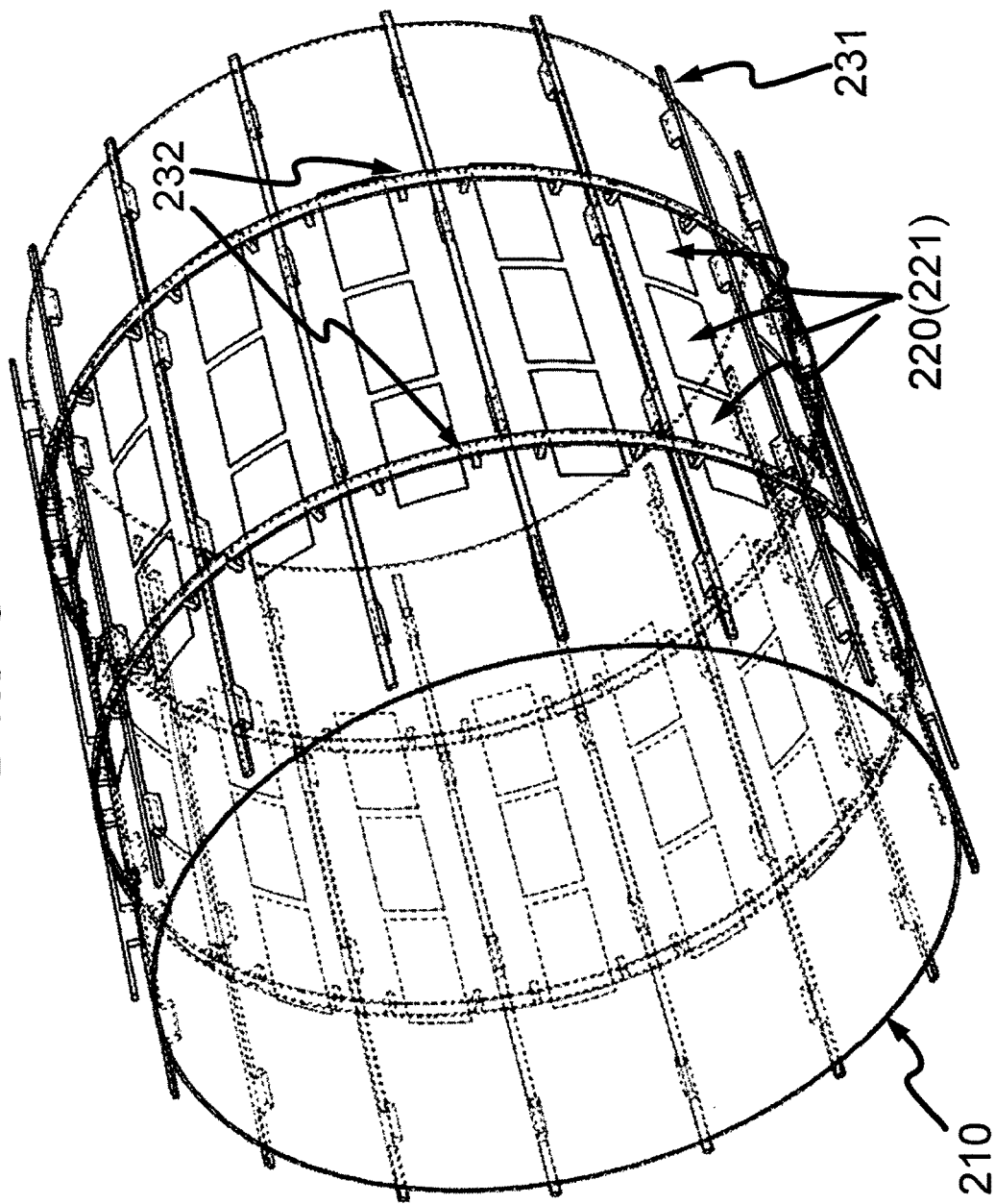
FIG. 6 is an explanatory view for explaining spacer members of the first embodiment.
Figure 7:
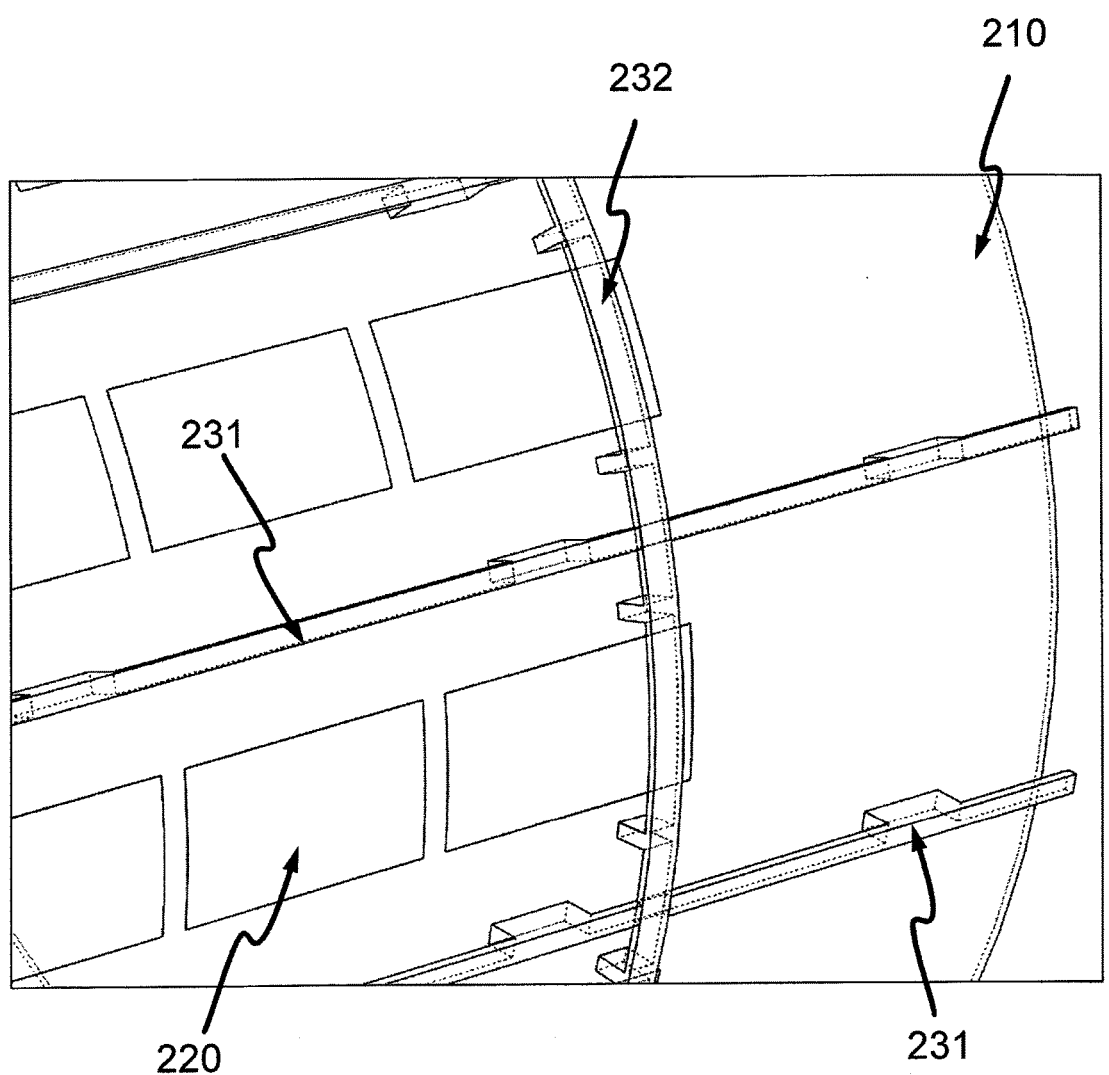
FIG. 7 is an explanatory view for explaining spacer members of the first embodiment.

The ribs 230 comprise linear members (linear ribs) 231 extending to one or more axial directions and arc-shaped members (arc-shaped ribs) 232 extending to one or more circumferential directions. FIGS. 6 and 7 are views for explaining arrangement of the linear ribs 231 and the arc-shaped ribs 232 and show the inner structure holding member 210, the rung conductors 220, the linear ribs 231, and the arc-shaped ribs 232 only.

Each of the linear ribs 231 have a structure like a bridge with abutments and girders, extend in the axial direction of the antenna device 200, and are arranged at certain intervals in the circumferential direction similarly to the rung conductors 220. In FIG. 6, they are arranged between the respective rung conductors 220. As shown in FIGS. 6 and 7, portions equivalent to the girders of the linear ribs 231 are adhered to the inner side of the shield conductor 240 i.e., an opposite side to the side adhered to the shield conductor holding member 250. The adhesion is made by using a double sided tape or the like. Hence, the thin shield conductor holding member 250 is prevented from being deformed and deflected. Also, portions equivalent to the abutments are attached to the outer circumferential surface of the inner structure holding member 210. The attachment is made by using screws or the like.

The arc-shaped ribs 232 are arc-shaped and have a structure like a bridge with piers and girders. The arc-shaped ribs 232 entirely cover the antenna device 200 and are arranged at certain intervals in the axial direction. FIG. 6 shows a case where two of the arc-shaped ribs are respectively arranged in the vicinities of both ends of the rung conductors 220 in the axial direction. As shown in FIGS. 6 and 7, portions equivalent to the piers are arranged over the rung conductors 220. As shown in FIGS. 6 and 7, portions equivalent to the girders of the arc-shaped ribs 232 are adhered to the inner side of the shield conductor 240 i.e., an opposite side to the side adhered to the shield conductor holding member 250. The adhesion is made by using a double sided tape or the like. Hence, the thin shield conductor holding member 250 is prevented from being deformed and deflected. Also, portions equivalent to the piers are attached to the outer circumferential surface of the inner structure holding member 210. The attachment is made by using screws or the like.

As shown in FIG. 6, 16 pieces of the linear ribs 231 and two pieces of the arc-shaped ribs 232 support the shield conductor 240 and the shield conductor holding member 250 on the outer side. Also, the shape allows the air to flow smoothly for cooling heat generated from the rung capacitors 271 or the like.

Additionally, although the arc-shaped ribs 232 are illustrated in a continuous cylindrical shape as shown in FIGS. 6 and 7, they may be divided into a plurality of pieces in the circumferential direction.

<Hole>

In the present embodiment, at least either one of the shield conductor 240 and the shield conductor holding member 250 or the inner structure holding member 210 is provided with the holes 260 as described above. Although FIG. 3 shows a case where 32 pieces of the holes 260 are provided, the number is not limited.

The holes 260 are used for attaching the shunt capacitors 270 between the rung conductors 220 and the shield conductor 240 when the antenna device 200 of the present embodiment is manufactured. Therefore, the holes are provided in the vicinities of connecting positions for the shunt capacitors 270. In the present embodiment, the holes are provided in the vicinities of both ends of the rung conductors 220 in the axial direction. Hereinafter, a case where the holes are provided on the shield conductor 240 and the shield conductor holding member 250 will be described in the present embodiment.

Figure 8:
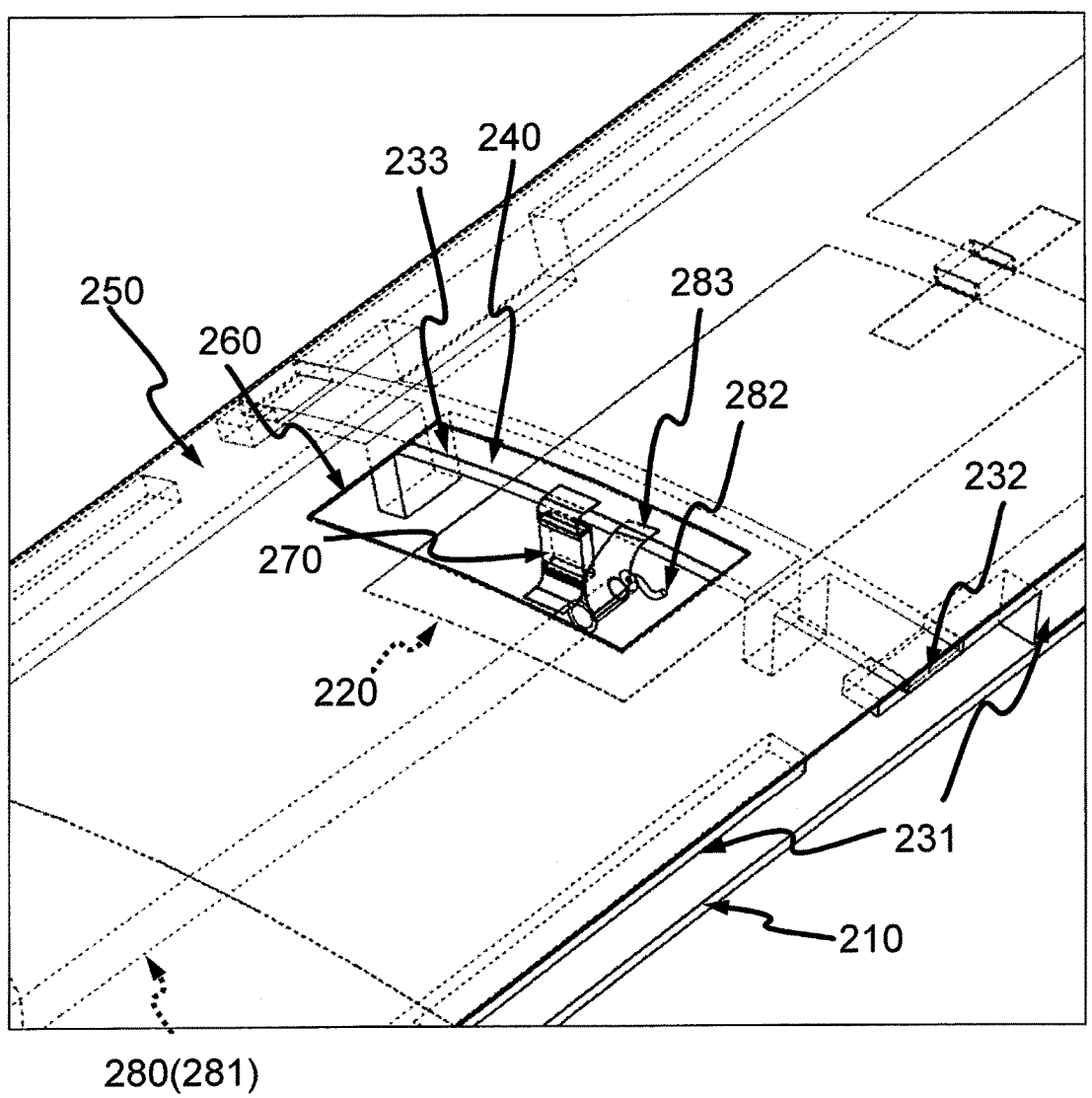
FIG. 8 is an explanatory view for explaining a connection state of the antenna device of the first embodiment.

FIG. 8 is an enlarged view of the vicinity of a hole 260. As described above, the holes 260 are provided on the shield conductor holding member 250 and the shield conductor 240, and the number of the holes 260 is double the number of the rung conductors 220. Furthermore, sizes of the holes 260 to be provided on the shield conductor 240 are smaller than those provided on the shield conductor holding member 250.

As shown in the present figure, a portion 233 of the arc-shaped rib 232 is arranged so that the hole 260 is superimposed on the rib, and the outer circumferential surface of the portion 233 of the arc-shaped rib 232 protruding toward the inside of the hole 260 is covered with the shield conductor 240. That is, the hole 260 provided on the shield conductor 240 is smaller than the hole 260 provided on the shield conductor holding member 250 by the area of the portion 233 protruding from the arc-shaped rib 232.

At the time when the antenna device 200 of the present embodiment is manufactured, the shunt capacitors 270 are connected to the positions covering the portions 233 protruding from the arc-shaped ribs 232 of the shield conductor 240 in order to the rung conductors 220. That is, such a structure allows the shunt capacitors 270 to be easily soldered to both of the shield conductor 240 and the rung conductors 220 from above FIG. 8.

In order to solder the shunt capacitors 270, a soldering iron, tweezers, a solder bar, and the like need to approach a soldering point, and the holes 260 make the approach easy. In the antenna device 200 of the present embodiment, the outer circumferential surface of the shield conductor 240 appears at a position where the hole 260 is superimposed on the arc-shaped rib 232, which allows leads at both ends of the shunt capacitors 270 to be soldered from above safely in FIG. 8.

Furthermore, as described above, the shield conductor 240 needs to cover the cylindrical surface formed by the antenna device 200 so that an electromagnetic wave at a frequency at which the antenna device 200 performs transmission and reception does not leak out of the shield. Therefore, it is desirable that sizes of the holes 260 are set minimally. That is, it is desirable that the sizes of the holes 260 are set to a minimally required size at which the shunt capacitors 270 can be connected through the holes 260.

<Power Supply Parts>

The power supply part 280 mainly comprises a coaxial cable 281 and is provided with a connection point 282 on the rung conductor 220 side and a connection point 283 on the shield conductor 240 side at an end on the antenna device 200 side as shown in FIG. 8. The other end is a connector such as an N-type connector.

A pair of the connection point 282 and the connection point 283 is a transmission and/or reception terminal as an antenna. A central conductor and an outer conductor of the coaxial cable 281 are respectively connected to the rung conductor 220 and the shield conductor 240 side. The coaxial cable 281 is used as the above transmission/reception cable 106 and connects the antenna device 200 to the main body of the MRI apparatus 100 (the transmitter receiver 104). The antenna device 200 transmits and receives an electromagnetic wave through the coaxial cable 281. Furthermore, the connection points 282 and 283 are referred to also as a transmission/reception terminal, a port of the antenna device 200, a power supply point, and the like. Also, a pair of the connection points 282 and 283 is provided for each channel.

Additionally, as shown in FIG. 3, a balun circuit that suppresses an electric current flowing in the outer conductor may be provided in the middle of the coaxial cable 281 of the power supply part 280 by bending the coaxial cable in the shape of a figure eight to connect the outer conductors using a capacitor with each other. Also, matching circuit functions may be provided for portions of the connection points 282 and 283 using a few lumped constant elements such as capacitors and inductors.

In the antenna device 200 of the present embodiment, power supply points for connecting the power supply parts 280 are provided in two positions 90 degrees away from each other to the central axis of the cylinder formed by the antenna device 200 as shown in FIG. 3. Specifically, the connection points 282 are provided for two of the rung conductors 220 90 degrees away from each other. However, four of the connection points may be provided at every 90 degrees.

<Production Procedure>

Next, the producing procedure of the antenna device 200 of the present embodiment will be described.

First, the rung conductor 220 is attached to the outer cylindrical surface of the inner structure holding member 210. Then, the rung capacitors 271 are soldered to the rung conductor 220. After that, the power supply part 280 is fixed to the inner structure holding member 210. Then, the linear ribs 231 and the arc-shaped ribs 232 are fixed to the inner structure holding member 210 by screwing or the like.

Also, the shield conductor 240 is attached to the inner surface (inner circumferential surface) of the shield conductor holding member 250 in advance. The holes 260 are provided respectively on the shield conductor holding member 250 and the shield conductor 240 in advance. The shield conductor 240 integrated with the shield conductor holding member 250 is adhered to girder portions of the linear ribs 231 and the arc-shaped ribs 232.

Lastly, the shunt capacitors 270 are soldered in the vicinities of the holes 260 of the shield conductor 240 in order to electrically connect the rung conductors 220 to the shield conductor 240. Also, two connection points on the shield conductor 240 side and the rung conductor 220 side are soldered at the tips of the power supply parts 280.

Specific Example

The following three types of body antennas to be used as the RF antenna 103 are manufactured under the following conditions in order to compare distances between the shield conductors and the rung conductors respectively.

The Body Antennas to be Manufactured
1) Birdcage-type antenna
2) Conventional TEM-type antenna
3) TEM-type antenna of the present embodiment Conditions
Inner diameter of the gradient magnetic field coils 102: 740 mm
Inner diameter of the antennas: 700 mm
Thickness of the innermost cylinders of the antennas: 3 mm A shield conductor of the birdcage-type antenna is generally embedded in a portion that is 1 mm deep from the inner walls of the gradient magnetic field coils 102. Therefore, a distance between the shield conductor and the rung conductor of the birdcage-type antenna can be calculated by (740−700)/2−3+1, and the calculation result is 18 mm.

In case of the TEM-type antenna, it is manufactured in advance and is inserted in the gradient magnetic field coils 102 before the installation. Therefore, a tolerance needs to be considered. The tolerance is set to 2 mm. In case of the conventional TEM-type antenna (the antenna device 300), the outer holding member needs to be used as a structural member in consideration of the production procedure. Hence, when a thickness of the outer holding member is set to 3 mm, a distance between the shield conductor and the rung conductor can be calculated by (740−2−700)/2−3−3, and the calculation result is 13 mm. This is only 72% distance compared with 18 mm of the above birdcage type.

In case of the TEM-type antenna of the present embodiment, the innermost cylinder is used as a structural body as it is (the inner structure holding member 210). Therefore, in a case where the other sizes are the same as the conventional TEM-type antenna and a thickness of the outer holding member (the shield conductor holding member 250) is set to 0.5 mm, a distance between the shield conductor and the rung conductor can be calculated by (740−2−700)/2−3−0.5, and the calculation result is 15.5 mm. This can be 86% distance compared with 18 mm of the above birdcage type.

As described above, the MRI apparatus 100 of the present embodiment comprises the cylindrical antenna device 200 that performs at least either one of transmitting or receiving an electromagnetic wave at a certain frequency. The antenna device 200 comprises the cylindrical inner structure holding member 210, a plurality of the rung conductors 220 extending to the axial direction of the inner structure holding member 210, the cylindrical shield conductor 240, and the cylindrical shield conductor holding member 250 that holds the shield conductor 240 in order from the inside toward the outside in the radial direction of the said antenna device 200. Between the inner structure holding member 210 and the shield conductor 240, the spacer members 230 are arranged to form spaces between the rung conductors 220 and the shield conductor 240. The plurality of rung conductors 220 are arranged at certain intervals along the circumferential direction of the inner structure holding member 210 on the outer circumferential surface of the said inner structure holding member 210. Both ends of the respective rung conductors 220 in the axial direction and the shield conductor 240 are electrically connected so that the said rung conductors 220 and the said shield conductor 240 form loop circuits. At least either one of the shield conductor 240 and the shield conductor holding member 250 or the inner structure holding member 210 is provided with the holes 260 in the vicinities where the rung conductor 220 and the shield conductor 240 are electrically connected. Each of the loop circuits is adjusted so as to resonate at an electromagnetic wave frequency at which the said antenna device 200 performs at least either one of transmission or reception. At least one of the loop circuits is provided with a power supply portion that performs at least either one of transmitting or receiving the electromagnetic wave.

Thus, according to the antenna device 200 of the present embodiment, because holes are provided on the shield conductor holding member 250 disposed outside and the shield conductor 240 even in case of a TEM-type antenna, the rung conductors 220 and the shield conductor 240 can be electrically connected through the holes. Therefore, the antenna device 200 can be electrically connected from the outer circumferential surface, which can form the inner cylinder (the inner structure holding member 210) that is an inner circumferential surface to a sturdy structural body. That is, a function as the structural body and a function for securing safety are compatible in the inner structure holding member 210. Then, this is capable of thinning the shield conductor holding member 250 that is the outer holding member, which is capable of thinning a thickness of the antenna device 200 in the radial direction.

Also, because a thickness of the antenna device 200 can be thinned in the radial direction, a distance between the shield conductor 240 and the rung conductor 220 can be maintained and kept wide to keep sensitivity of the antenna even in a case where a difference between the inner and outer diameters of an antenna installation space is small.

Therefore, according to the antenna device 200 of the present embodiment, a certain inner diameter can be secured without decreasing the distance between the rung conductor 220 and the shield conductor 240. Hence, because a difference between the cylindrical inner and outer diameters can be reduced without reducing the sensitivity in the antenna device 200 of the present embodiment, a comfortable large examination space can be provided for the object 112.

Also, according to the antenna device 200 of the present embodiment, a thickness of the antenna device 200 can be thinned in the radial direction, and a distance between the shield conductor 240 and the rung conductor 220 can be kept wide even in a case where a difference between the inner and outer diameters of the antenna device 200 is small, which can keep sensitivity of the antenna.

Thus, according to the antenna device 200 of the present embodiment, safety, usability, and sensitivity are compatible with each other. Also, according to the present embodiment, such an antenna device can be manufactured easily.

Second Embodiment

Next, a second embodiment of the present invention will be described. In the first embodiment, an antenna device to be used as the RF antenna 103 was a TEM-type antenna. On the other hand, in the present embodiment, an antenna device to be used as the RF antenna is a microstrip-line-type antenna.

The MRI apparatus of the present embodiment basically has a similar configuration to the MRI apparatus 100 of the first embodiment. However, as described above, the present embodiment uses an antenna device 400 that is a microstrip-line-type antenna as the RF antenna 103.

While a TEM-type antenna has only two independent channels that are less coupled with each other, a microstrip-line-type antenna is characterized by having N independent channels when the number of rungs is set as N (N is an integer equal to or more than 1).

Figure 9:
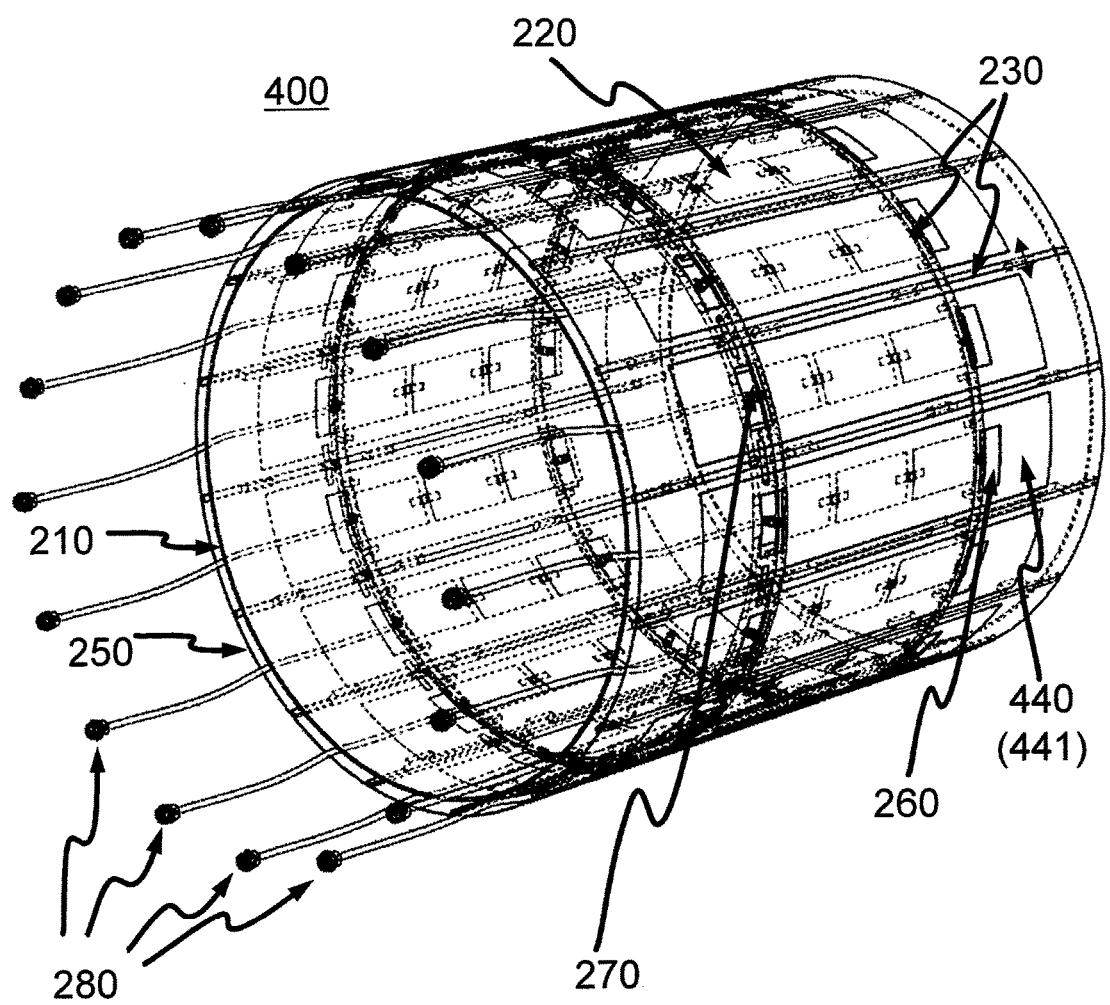
FIG. 9 is a perspective view of the antenna device of a second embodiment.

FIG. 9 is an external perspective view of the antenna device 400 of the present embodiment. As shown in FIG. 9, the antenna device 400 of the present embodiment is a cylindrical device that performs at least either one of transmitting or receiving an electromagnetic wave at a certain frequency. Hereinafter, also in the antenna device 400, the central axis direction of the antenna device is referred to as the axial direction, a circumferential direction of the cross-sectional circle orthogonal to the central axis is referred to as the circumferential direction, and a diameter direction is referred to as the radial direction.

As shown in FIG. 9, the antenna device 400 of the present embodiment, similarly to the antenna device 200 of the first embodiment, comprises the cylindrical inner structure holding member 210, a plurality of the rung conductors 220 extending to the axial direction of the inner structure holding member 210, a cylindrical shield conductor 440, and the cylindrical shield conductor holding member 250 that holds the shield conductor 440 in order from the inside toward the outside in the radial direction. Then, between the inner structure holding member 210 and the shield conductor 440, the spacer members (hereinafter, referred to as ribs) 230 are arranged to form spaces between the rung conductors 220 and the shield conductor 440.

Although FIG. 9 shows a 16-channel microstrip-type antenna that is provided with 16 sets of the rung conductors 220 as an example, the number of the rung conductors 220 and the channel number N are not limited.

Also, in the antenna device 400 of the present embodiment, the holes 260 are provided on at least either one of the inner structure holding member 210 or the shield conductor holding member 250 and the shield conductor 440 similarly to the first embodiment. The rung conductors 220 and the shield conductor 440 are electrically connected with the shunt capacitors 270 in portions adjacent to the holes 260. Hence, the rung conductors 220 and the shield conductor 440 form loop-shaped conductors (loop circuits).

The inner structure holding member 210, the rung conductors 220, the ribs 230, the shield conductor holding member 250, the holes 260, and the shunt capacitors 270 are similar to those of the first embodiment including the names and the configuration. Hereinafter, the antenna device 400 of the present embodiment will be described by focusing a different configuration from the antenna device 200 of the first embodiment.

A decoupling circuit is provided because the shield conductor 440 is divided by the number of channels and interrupts coupling between adjacent channels, which is a main structural difference from the antenna device 200 that is a TEM-type antenna of the first embodiment.

The shield conductor 440 of the antenna device 400 of the present embodiment is divided parallel to the axis in the circumferential direction by the number of channels. For example, the shield conductor is divided by the number of the rung conductors 220 in the present embodiment. That is, the shield conductor is divided into 16 portions in FIG. 9.

Hereinafter, each of the divided shield conductors 440 is referred to as a segmental shield conductor 441.

Figure 10:
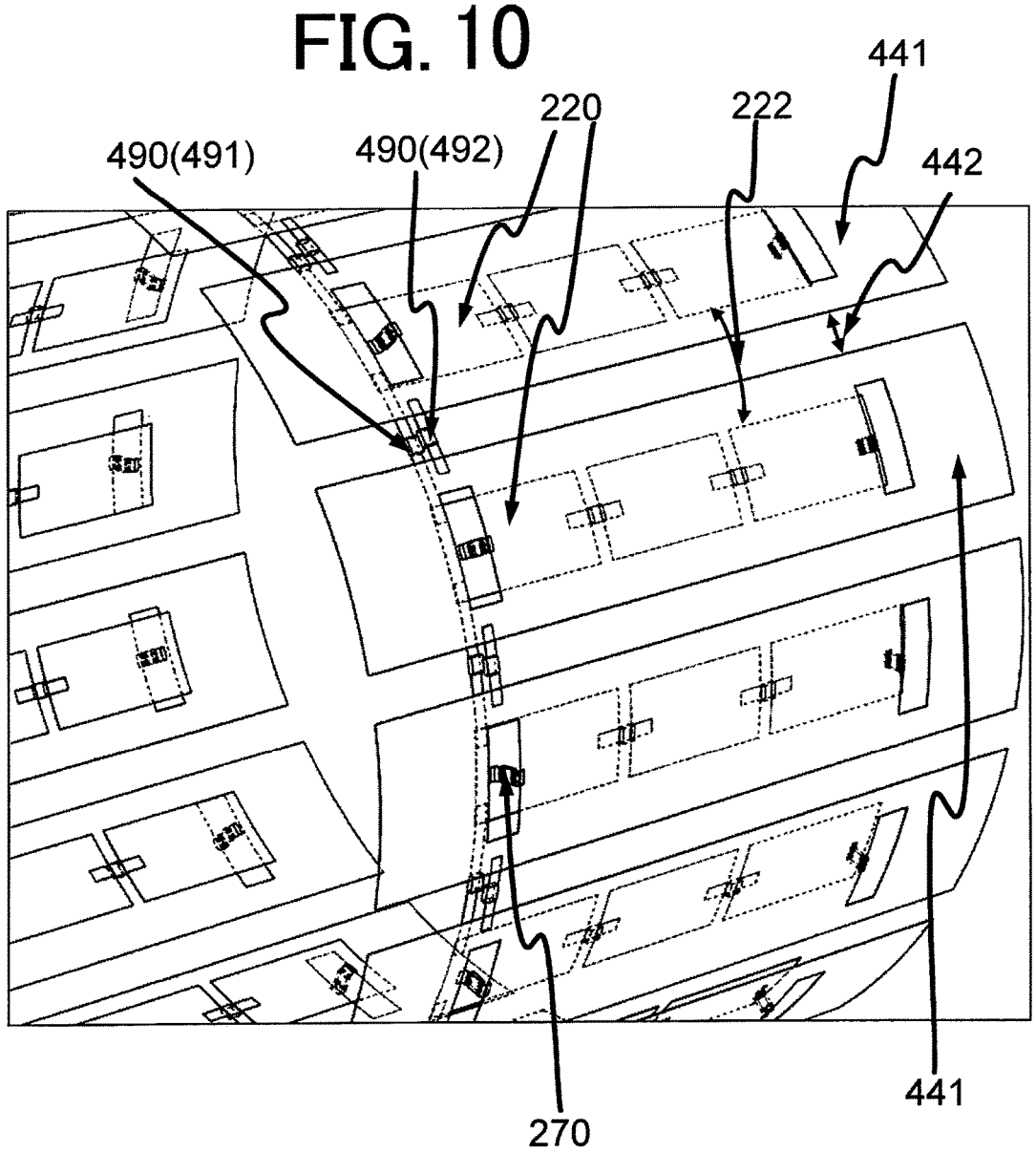
FIG. 10 is an explanatory view for explaining configuration of the second embodiment.

FIG. 10 is an explanatory view enlarging only the electrical circuit portion in the external perspective view of the antenna device 400 of the present embodiment shown in FIG. 9. Although a mirror image current of an electric current flowing in the rung conductors 220 flows in the shield conductor 440, the shield conductor is divided so that each of the divided shield conductors normally has a larger area than a rung conductor in order to sufficiently cover a range in which the mirror image current flows as shown in FIG. 10. The segmental shield conductors 441 corresponding to the respective rung conductors 220 are arranged in the circumferential direction at certain intervals 442 on the inner circumferential surface of the shield conductor holding member 250 similarly to the rung conductors 220. The respective segmental shield conductors 441 and the respective rung conductors 220 are electrically connected with the shunt capacitor 270.

Additionally, the power supply parts 280 are connected to each channel also in the present embodiment. Therefore, 16 pieces of the power supply parts 280 of the present embodiment are connected in an example shown in FIG. 9. Additionally, a configuration of the respective power supply parts 280 is similar to the first embodiment.

Furthermore, the antenna device 400 is provided with decoupling circuits 490 to remove coupling between adjacent channels. The present embodiment includes decoupling capacitors 491 and 492 as the decoupling circuits 490.

As shown in FIG. 10, the intervals 442 are provided between the segmental shield conductors 441 in the antenna device 400 of the present embodiment. The decoupling capacitors 492 are disposed between the adjacent segmental shield conductors 441, and the decoupling capacitors 491 are disposed between the adjacent rung conductors 220.

Additionally, although the decoupling capacitors 491 and 492 are respectively installed on one side ends of the rung conductors 220 and the segmental shield conductors 441 extending to the axial direction, they may be installed on both ends of the respective conductors.

Also, the decoupling circuits 490 are not limited to capacitors, and inductors may be used. Hence, a cylindrical microstrip-line-type antenna with three or more channels and high sensitivity can be manufactured even in an installation environment where a difference between the outer and inner diameters is small.

<Production Procedure>

Next, the producing procedure of the antenna device 400 of the present embodiment will be described. Here, a different procedure from the antenna device 200 of the first embodiment will be mainly described.

Installing the rung conductors 220 on the inner structure holding member 210, installing the power supply parts 280, and fixing the ribs 230 are performed similarly to the first embodiment. However, the decoupling capacitor 491 is disposed between the adjacent rung conductors 220 in the antenna device 400 of the present embodiment in order to prevent coupling between adjacent channels.

On the other hand, first, the shield conductor 440 is divided into 16 pieces on the shield conductor holding member 250 side in the antenna device 400 of the present embodiment. Then, the intervals (spaces) 442 are provided between the segmental shield conductors 441 adjacent in the circumferential direction, and the segmental shield conductors 441 are attached to the inner circumferential surface of the shield conductor holding member 250. As shown in FIG. 10, it is desired that the attachment is performed so that the center in the circumferential direction of an interval 222 between the adjacent rung conductors 220 approximately corresponds to the center in the circumferential direction of the space 442. Also, the decoupling capacitor 492 is disposed between the adjacent segmental shield conductors 441 in the antenna device 400 of the present embodiment in order to prevent coupling between adjacent channels.

At this time, the holes 260 are respectively provided for the shield conductor holding member 250 and the respective segmental shield conductors 441 similarly to the antenna device 200. A plurality of the segmental shield conductors 441 integrated with the shield conductor holding member 250 are adhered to girder portions of the linear ribs 231 and the arc-shaped ribs 232.

Lastly, the shunt capacitors 270 are soldered in the vicinities of the holes 260 of the shield conductor 440 in order to electrically connect the rung conductors 220 to the segmental shield conductors 441. Also, two connection points on the shield conductor 440 side and the rung conductor 220 side are soldered at the tips of the power supply parts 280. Additionally, the power supply parts 280 are provided by the number of channels. That is, a power supply part 280 is connected to each of the segmental shield conductors 441. In an example shown in FIG. 9, 16 pieces of the power supply parts 280 are provided.

As described above, the MRI apparatus 100 of the present embodiment is provided with a normal antenna device 400 that performs at least either one of transmitting or receiving an electromagnetic wave at a certain frequency. The antenna device 400 comprises a cylindrical inner structure holding member 210, a plurality of rung conductors 220 extending to the axial direction of the inner structure holding member 210, a cylindrical shield conductor 440, and a cylindrical shield conductor holding member 250 that holds the shield conductor 440 in order from the inside toward the outside in the radial direction of the said antenna device 400. Between the inner structure holding member 210 and the shield conductor 440, spacer members 230 are arranged to form spaces between the rung conductors 220 and the shield conductor 440. The plurality of the rung conductors 220 are arranged at certain intervals along the circumferential direction of the inner structure holding member 210 on the outer circumferential surface of the said inner structure holding member 210. Both ends of the respective rung conductors 220 in the axial direction are electrically connected to the shield conductor 440 so that the said rung conductors 220 and the said shield conductor 440 form loop circuits. At least either one of the shield conductor 440 and the shield conductor holding member 250 or the inner structure holding member 210 is provided with holes 260 in the vicinities where the rung conductors 220 and the shield conductor 440 are electrically connected. Each of the loop circuits is adjusted so as to resonate at an electromagnetic wave frequency at which the said antenna device 400 performs at least either one of transmission or reception. At least one of the loop circuits is provided with a power supply portion that performs at least either one of transmitting or receiving the electromagnetic wave.

Then, the shield conductor 440 is divided into segmental shield conductors 441 whose number is equal to or less than that of the rung conductors 220 in the circumferential direction of the shield conductor holding member 250, and each of the loop circuits is provided with the power supply portion.

Thus, according to the antenna device 400 of the present embodiment, a function as the structural body and a function for securing safety are compatible in the inner structure holding member 210 similarly to the antenna device 200 that is a TEM-type antenna of the first embodiment even in case of a microstrip-type antenna. Therefore, a thickness in the radial direction of the antenna device 400 can be thinned.

Therefore, according to the antenna device 400 of the present embodiment, a certain inner diameter can be secured without reducing distances between the rung conductors 220 and the shield conductor 440. Hence, the antenna device 400 of the present embodiment can reduce a difference between the outer and inner diameters of a cylinder without reducing sensitivity, which can provide a comfortable large examination space for the object 112.

That is, usability, safety, and sensitivity are compatible.

Additionally, in the above first and second embodiments, the shield conductor holding member 250 and the inner structure holding member 210 forming the exteriors of the antenna devices 200 and 400 have cylinder shapes. However, these shapes are not limited to a cylinder but may be an oval cylinder for example. In this case, arc-shaped ribs are changed to oval-arc-shaped ribs.

Figure 11:
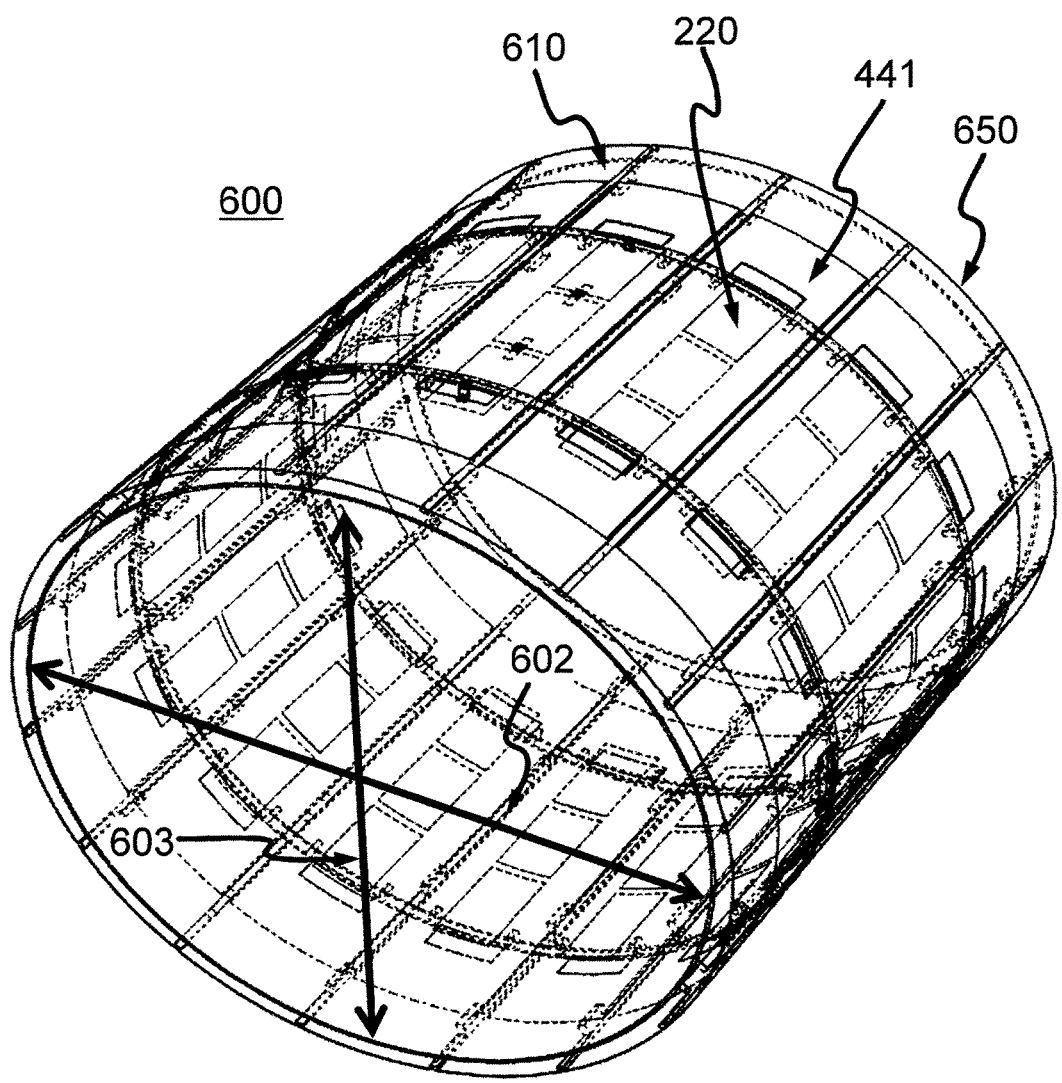
FIG. 11 is a perspective view of a transformation example of the antenna device of the second embodiment.

FIG. 11 is an external perspective view of an antenna device 600 in which shapes of a shield conductor holding member and an inner structure holding member of the antenna device 400 in the second embodiment are changed to an oval arc shape (a shield conductor holding member 650 and an inner structure holding member 610). A cross section orthogonal to the axial direction pf the antenna device 600 forms an oval having a long axis 602 and a short axis 603.

Since an object 112 normally lies on its back in the inner space of the MRI apparatus 100, comfortableness of the object is further improved by using the antenna device 600 whose cross section has an oval shape.

Third Embodiment

Next, a third embodiment of the present invention will be described. The antenna device of the present embodiment is a microstrip-type antenna similarly to the second embodiment. However, not only a shield conductor but also shield conductor holding member is divided by the number of channels in the present embodiment. The antenna device of the present embodiment is a microstrip-type antenna device with a plurality of channels, a rung conductor of each channel is divided into a plurality of pieces in the circumferential direction, and they are electrically connected in the circumferential direction at both ends in the axial direction. Also, the cylinder shape is an oval.

The MRI apparatus of the present embodiment basically has a similar configuration to the MRI apparatus 100 of the first embodiment. However, an antenna device 500 that is a microstrip-line-type antenna is used as the RF antenna 103 in the present embodiment similarly to the second embodiment.

Figure 12:
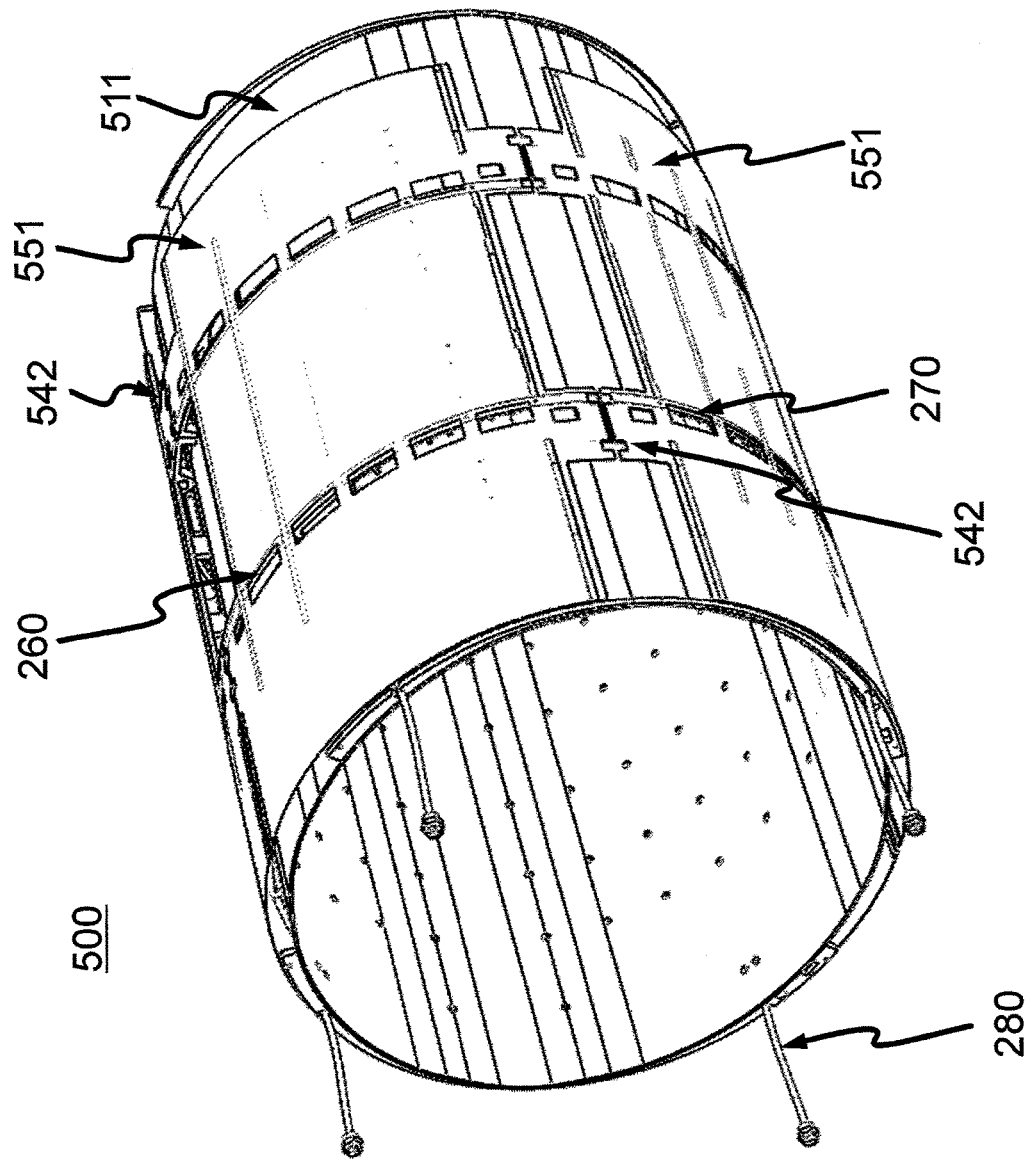
FIG. 12 is a perspective view of the antenna device of a third embodiment.

FIG. 12 is an external perspective view of the antenna device 500 of the present embodiment. Also, FIG. 13(a) is a cross-sectional view of a cross section vertical to the central axis of the antenna device 500 of the present embodiment and an explanatory view for explaining the configuration. Here, a case of four channels will be shown. However, the number of channels is not limited to this.

As shown in FIG. 12 and FIG. 13(a), the antenna device 500 of the present embodiment is an antenna device with a plurality of channels that performs at least either one of transmitting or receiving an electromagnetic wave at a certain frequency and is a device that is provided with segmented oval cylinder-shaped single channel portions 501 corresponding to the number of channels and has an entirely oval cylindrical shape. Hereinafter, also in case of the antenna device 500, the central axial direction of the antenna device is referred to as the axial direction, an oval circumferential direction of the cross-sectional oval orthogonal to the central axis is referred to as the circumferential direction, and a diameter direction is referred to as the radial direction. The segmented oval cylindrical shape is a shape in which the oval cylinder is divided into a plurality of the oval cylinders in the circumferential direction parallel to the axial direction.

As shown in FIG. 13(a), the antenna device 500 of the present embodiment provided with an inner structure holding member 510 and the segmented oval cylinder-shaped single channel portions 501 corresponding to the number of channels in order from the inside toward the outside in the radial direction. The single channel portions 501 corresponding to the number of channels are arranged at certain intervals in the circumferential direction of the antenna device 500 on the outer surface of the inner structure holding member 510.

The inner structure holding member 510 of the present embodiment is a structural member disposed closest to the object 112 side similarly to the inner structure holding member 210 of the first embodiment, and the thickness and the material are similar to the inner structure holding member 210 of the first embodiment. However, the cross-sectional shape orthogonal to the axial direction is an oval shape.

Each of the single channel portions 501 comprises the rung conductor 520 extending to the axial direction, a segmented cylindrical shield conductor 541 having a segmented cylindrical shape, and a segmented cylindrical shield conductor holding member 551 having a segmented cylindrical shape holding the segmented cylindrical shield conductor 541 in order from the inside toward the outside in the radial direction of the antenna device 500.

Additionally, although the antenna device 500 comprises the other components as described later, these components are omitted in FIG. 13(a).

Also, the segmented cylindrical shield conductors 541 and the segmented cylindrical shield conductor holding members 551 are formed by respectively dividing the shield conductor 240 and the shield conductor holding member 250 included in the oval cylinder of the antenna device 200 of the first embodiment in the circumferential direction parallel to the central axis corresponding to the number of channels.

The material and the thickness of the segmented cylindrical shield conductors 541 and the segmented cylindrical shield conductor holding members 551 are respectively the same as those of the shield conductor 240 and the shield conductor holding member 250 in the first embodiment.

Also in the present embodiment, the segmented cylindrical shield conductors 541 are adhered to the entire inner surfaces of the segmented cylindrical shield conductor holding members 551 similarly to the configuration where the shield conductor 240 is adhered to the entire inner surface of the shield conductor holding member 250 in the first embodiment.

FIG. 13(b) is a developed plan view of the rung conductor 520. As shown in the present figure, the rung conductor 520 to be provided for each channel is divided into a plurality of pieces in the circumferential direction parallel to the central axis in order to achieve a wide sensitivity range. Each portion of the divided rung conductors 520 is referred to as a segmental rung conductor 522.

Both ends of each segmental rung conductor 522 are connected to the segmental rung conductors 522 adjacent to each other in a high-frequency manner with a low impedance using high-capacity capacitors 573 of approximately 2000 pF for example. Such a structure can extend the sensitivity range in the circumferential direction to improve sensitivity uniformity inside the oval cylinder. Additionally, FIG. 13(b) shows a case where the rung conductor 520 is divided into five pieces.

The details of each segmental rung conductor 522 are the same as the rung conductor 220 of the first embodiment.

That is, the rung conductor is divided into a plurality of rung conductor strips in the axial direction, and the rung conductor strips are connected with the rung capacitors 271.

Both ends in the axial direction of each segmental rung conductor 522 and the segmented cylindrical shield conductors 541 are electrically connected so that the segmental rung conductors 522 and the segmented cylindrical shield conductors 541 form loop circuits. The electrical connection is performed by the shunt capacitors 270 or the like for example.

Also in the present embodiment, each loop circuit is adjusted so as to resonate at an electromagnetic wave frequency at which the said antenna device 500 performs at least either one of transmission or reception. The adjustment is performed by adjusting a capacity of the shunt capacitors 270.

Also in the present embodiment, the holes 260 are provided in the vicinities of electrical connecting positions between the segmental rung conductors 522 and the segmented cylindrical shield conductors 541 of at least either one of the segmented cylindrical shield conductors 541 and the segmented cylindrical shield conductor holding members 551 or the inner structure holding member 510.

FIG. 12 shows a case where the holes 260 are provided on the segmented cylindrical shield conductor holding members 551 and the segmented cylindrical shield conductors 541. The holes 260 are provided in order to connect the rung conductors 520 to the segmented cylindrical shield conductors 541 similarly to the first embodiment when the antenna device 500 is manufactured. Therefore, the holes 260 should be provided in required positions and by the required number for the connection. For example, the holes 260 are provided by double the number of the segmental rung conductors 522. The details are the same as the first embodiment.

Furthermore, the single channel portions 501 are respectively connected to the power supply parts 280 that perform at least either one of transmitting or receiving an electromagnetic wave. In an example of the antenna device 500 shown in FIG. 12, four of the power supply parts 280 are provided because the antenna device 500 is an antenna device with four channels. Each of the segmented cylindrical shield conductors 541 is provided with a power supply portion that performs at least either one of transmitting or receiving the electromagnetic wave, and these power supply parts 280 are connected through the power supply portions.

Also, spacer members (ribs) 530 are arranged between the inner structure holding member 510 and the segmented cylindrical shield conductors 541 in order to form spaces between the rung conductors 520 and the segmented cylindrical shield conductors 541. The function is the same as that of the ribs 230 of the first embodiment. The ribs 530 of the present embodiment also include linear ribs 531 and segmented oval arc-shaped ribs 532 similarly to the first embodiment.

In order to explain the arrangement of the ribs 530 of the antenna device 500, FIG. 14 shows a partially enlarged view where the segmented cylindrical shield conductor holding members 551 and the segmented cylindrical shield conductors 541 are removed to expose the ribs 530 (the linear ribs 531 and the segmented oval arc-shaped ribs 532). Additionally, circuit parts such as the shunt capacitors 270, the rung capacitors 271, and the capacitors 573 are omitted in FIG. 14.

The linear ribs 531 have a structure having abutments and girders similarly to the linear ribs 231 of the first embodiment, extend toward the axial direction of the antenna device 500, and are arranged at certain intervals in the circumferential direction. The installation on the inner structure holding member 510 and the segmented cylindrical shield conductor holding members 551 is the same as that of the linear ribs 231 of the first embodiment.

The segmented oval arc-shaped ribs 532 have segmented oval arc-shaped girders into which an oval arc is divided in the circumferential direction and piers. In the present embodiment, a plurality of the segmented oval arc-shaped ribs 532 are arranged at certain intervals in the axial direction. The installation on the inner structure holding member 510 and the segmented cylindrical shield conductor holding members 551 is the same as that of the arc-shaped ribs 232 of the first embodiment.

That is, the segmental rung conductors 522 are adhered on the outer circumferential surface of the inner structure holding member 510.

Then, avoiding the segmental rung conductors 522, the linear ribs 531 and the segmented oval arc-shaped ribs 532 are installed on the outer circumferential surface of the inner structure holding member 510.

FIG. 15 is an explanatory (transparent) view for explaining the segmented cylindrical shield conductors 541, the segmental rung conductors 522, the power supply parts 280, and a decoupling bridge 591 to be described later of the antenna device 500.

Additionally, in the antenna device 500 of the present embodiment, the adjacent single channel portions 501 that were divided into a plurality of (four) pieces are connected to each other in the circumferential direction in order to form an oval cylinder-shaped antenna device 500. Specifically, the segmented cylindrical shield conductor holding members 551 and the segmented cylindrical shield conductors 541 are respectively connected to those of the adjacent single channel portion 501. At this time, the segmented cylindrical shield conductors 541 are connected to each other using connecting portions 542.

Also, because the antenna device 500 of the present embodiment is a microstrip-type antenna device, decoupling circuits 590 are provided in order to prevent coupling between adjacent channels similarly to the second embodiment. In the present embodiment, the decoupling bridge 591 that is a segmental rung conductor 522 of the adjacent single channel portion 501 and connects the adjacent segmental rung conductors 522 is used as the decoupling circuit 590.

Next, the production procedure of the antenna device 500 of the present embodiment will be described.

First, the segmental rung conductors 522 are attached to the outer cylindrical surface of the inner structure holding member 510. Then, the rung capacitors 271 and the capacitors 573 are soldered to the respective rung conductors 520. After that, the power supply parts 280 are fixed to the inner structure holding member 510. Then, the linear ribs 531 and the segmented oval arc-shaped ribs 532 are fixed to the inner structure holding member 510 by screwing or the like.

Also, the segmented cylindrical shield conductors 541 are attached to the inner surfaces (inner circumferential surfaces) of the segmented cylindrical shield conductor holding members 551 in advance. The holes 260 are provided respectively on the segmented cylindrical shield conductor holding members 551 and the segmented cylindrical shield conductors 541 in advance. The segmented cylindrical shield conductors 541 integrated with the segmented cylindrical shield conductor holding members 551 are adhered to girder portions of the linear ribs 531 and the segmented oval arc-shaped ribs 532.

Then, the shunt capacitors 270 are soldered in the vicinities of the holes 260 of the segmented cylindrical shield conductors 541 in order to electrically connect the segmental rung conductors 522 to the segmented cylindrical shield conductors 541. Also, two connection points on the segmented cylindrical shield conductor 541 side and the segmental rung conductor 522 side are soldered at the tips of the power supply parts 280.

Lastly, the adjacent segmental rung conductors 522 of the respective single channel portions 501 are connected using the decoupling bridges 591, and a segmented cylindrical shield conductor 541 is connected to that of the adjacent single channel portion 501, which forms the oval cylinder-shaped antenna device 500.

Additionally, although a case where the antenna device 500 has an oval cylindrical shape was described as an example in the present embodiment, the antenna device 500 of the present embodiment may have a cylindrical shape. In this case, the inner structure holding member 510 has a cylindrical shape, and the respective single channel portions 501 have a shape in which a cylinder is divided in the circumferential direction parallel to axis. Also, the segmented oval arc-shaped ribs 532 change to segmental arc-shaped ribs.

As described above, the MRI apparatus 100 of the present embodiment is provided with a cylindrical antenna device 500 with a plurality of channels that performs at least either one of transmitting or receiving an electromagnetic wave at a certain frequency. The antenna device 500 comprises a cylindrical inner structure holding member 510 and segmented cylindrical single channel portions 501 corresponding to the number of channels in order from the inside toward the outside in the radial direction. Each of the single channel portions 501 comprises a plurality of segmental rung conductors 522 extending to the axial direction of the antenna device 500, segmented cylindrical shield conductors 541 with the segmented cylindrical shape, and the segmented cylindrical shield conductor holding members 551 holding the segmented cylindrical shield conductors 541 with the segmented cylindrical shape. The single channel portions 501 corresponding to the number of channels are arranged at certain intervals in the circumferential direction of the antenna device 500 on the outer surface of the inner structure holding member 510. Between the inner structure holding member 510 and the segmented cylindrical shield conductors 541, spacer members 530 are arranged to form spaces between the segmental rung conductors 522 and the segmented cylindrical shield conductors 541. The plurality of the segmental rung conductors 522 are arranged at certain intervals in the circumferential direction of the antenna device 500 on the outer circumferential surface of the said inner structure holding member 510. Both ends of the respective segmental rung conductors 522 in the axial direction are electrically connected to the segmented cylindrical shield conductors 541 so that the said segmental rung conductors 522 and the said segmented cylindrical shield conductors 541 form loop circuits. At least either one of the segmented cylindrical shield conductors 541 and the segmented cylindrical shield conductor holding members 551 or the inner structure holding member 510 is provided with holes 260 in the vicinities where the segmental rung conductors 522 and the segmented cylindrical shield conductors 541 are electrically connected. Each of the loop circuits is adjusted so as to resonate at an electromagnetic wave frequency at which the said antenna device 500 performs at least either one of transmission or reception. Each of the segmented cylindrical shield conductors 541 is provided with a power supply portion that performs at least either one of transmitting or receiving the electromagnetic wave.

Thus, according to the antenna device 500 of the present embodiment, a function as the structural body and a function for securing safety are compatible in the inner structure holding member 510 similarly to the antenna device 200 that is a TEM-type antenna of the first embodiment even in case of a microstrip-type antenna. Therefore, a thickness in the radial direction of the antenna device 500 can be thinned.

Therefore, according to the antenna device 500 of the present embodiment, a certain inner diameter can be secured without reducing distances between the rung conductors 520 and the segmented cylindrical shield conductors 541. Hence, the antenna device 500 of the present embodiment can reduce a difference between the outer and inner diameters of a cylinder without reducing sensitivity, which can provide a comfortable large examination space for the object 112.

That is, usability, safety, and sensitivity are compatible.

Additionally, although only the single channel portions 501 have a divided structure of a segmented cylindrical shape in the present embodiment, the structure is not limited to this. Similarly, the inner structure holding member 510 may also have a segmented cylindrical shape divided by the number of channels in the circumferential direction parallel to the axial direction. In this case, in order to manufacture the antenna device 500, segmented cylindrical coils in which a cylinder was divided per channel in the circumferential direction may be manufactured and assembled into a cylinder finally.

Also, although a case of using one sheet of sheet-shape conductor as each of the segmented cylindrical shield conductors 541 is described in the present embodiment, the shape is not limited to this. For example, as shown in FIG. 15, a part of conductors finely divided into a shape of tile may be used. Using such a shape can prevent an eddy current generated by a gradient magnetic field, which results in preventing heat generation.

In this case, each of the segmented cylindrical shield conductors 541 is manufactured by attaching copper foil with a thickness of approximately 12 microns to both sides of a polyimide film whose thickness is approximately 25 microns for example. That is, a double sided copper foil sheet is used for the segmented cylindrical shield conductors 541 in this case. Additionally, FIG. 15 shows only the tile-shaped pattern of copper foil on the inside in order to simplify the explanation. Actually, a different striped tile pattern whose position is deviated from the inside is formed also on the outside copper foil by etching. Although a direct electrical current disconnects both the striped tile patterns, a high frequency capacitively couples both the striped tile patterns, and they become conductors.

Such conductors divided into a shape of tile can be used also for shield conductors of the first and second embodiments.

Also, although the number of the holes 260 is double the number of the rung conductors by making the hole size as small as possible in each of the above embodiments, the number is not limited to this. Because the respective rung conductors and the shield conductor should be electrically connected through the said holes 260, the number of the holes 260 is not limited.

As described above, in a TEM-type or microstrip-line-type antenna device to be used for an MRI apparatus, holes are provided on any portion of the cylindrical surface of the antenna device, and a shield conductor and rung conductors are electrically connected in the vicinities of the holes in order to form loop circuits according to each embodiment.

Therefore, in an antenna device that needs to be integrally manufactured in advance and is provided with a shield conductor almost covering the outer surface, the inner surface of the antenna device can be formed to a sturdy structural body. That is, a function as the structural body and a function for securing safety are compatible on the inner surface. Therefore, the outer surface does not need to be the structural body, which can manufacture the antenna device thinly. A thickness of the entire antenna device can be thinned in the radial direction without reducing a difference between the inner and outer diameters of the antenna device.

Hence, according to the above respective embodiments, an antenna device having an open inner space can be provided without reducing the sensitivity.

Additionally, the antenna devices of the above respective embodiments may be a reception dedicated antenna or a transmission dedicated antenna and a transmission/reception antenna. Also, the antenna devices of the above respective embodiments are used not only as an RF antenna of an MRI apparatus and are applicable to all devices that use electromagnetic waves having frequencies from a few MHz to a few GHz.

REFERENCE SIGNS LIST

100: MRI apparatus
101: magnets
102: gradient magnetic field coils
103: RF antenna
104: transmitter receiver
105: data processing unit
106: transmission/reception cable
107: gradient magnetic field control cable
108: display device
109: gradient magnetic field power source
111: bed
112: object
200: antenna device
210: inner structure holding member
220: rung conductors
221: rung conductor strips
222: interval
230: ribs (spacer members)
231: linear ribs
232: arc-shaped ribs
233: portion of the arc-shaped rib
240: shield conductor
250: shield conductor holding member
260: hole
270: shunt capacitors
271: rung capacitors
280: power supply parts
281: coaxial cable
282: connection point
283: connection point
300: antenna device
320: rung conductors
321: rung conductor strips
340: shield conductor
370: shunt capacitor
371: rung capacitors
380: power supply parts
400: antenna device
440: shield conductor
441: segmental shield conductor
442: interval
490: decoupling circuits
491: decoupling capacitors
492: decoupling capacitors
500: antenna device
501: single channel portions
510: inner structure holding member
520: rung conductor
522: segmental rung conductor
530: ribs (spacer members)
531: linear ribs
532: segmented oval arc-shaped ribs
541: segmented cylindrical shield conductors
542: connecting portions
551: segmented cylindrical shield conductor holding members
573: capacitors
590: decoupling circuit
591: decoupling bridge
600: antenna device
602: long axis
603: short axis
610: inner structure holding member
650: shield conductor holding member

The invention claimed is:

1. A magnetic resonance imaging apparatus comprising:
a cylindrical antenna device that performs at least either one of transmitting or receiving an electromagnetic wave at a certain frequency,
wherein, in order from the inside toward the outside in the radial direction of the antenna device, the said antenna device comprises:
   a cylindrical inner structure holding member;
   a plurality of rung conductors extending to the axial direction of the inner structure holding member;
   a cylindrical shield conductor; and
   a cylindrical shield conductor holding member that holds the shield conductor,
wherein, between the inner structure holding member and the shield conductor, spacer members are arranged to form spaces between the rung conductors and the shield conductor,
wherein the plurality of rung conductors are arranged at certain intervals along the circumferential direction of the inner structure holding member on the outer circumferential surface of the said inner structure holding member,
wherein both ends of the respective rung conductors in the axial direction are electrically connected to the shield conductor so that the said rung conductors and the said shield conductor form loop circuits,
wherein at least either one of the shield conductor and the shield conductor holding member or the inner structure holding member is provided with holes in the vicinities where the rung conductors and the shield conductor are electrically connected,
wherein each of the loop circuits is adjusted so as to resonate at an electromagnetic wave frequency at which the said antenna device performs at least either one of transmission or reception, wherein at least one of the loop circuits is provided with a power supply portion that performs at least either one of transmitting or receiving the electromagnetic wave, wherein the holes are provided on the shield conductor and the shield conductor holding member, wherein sizes of the holes to be provided on the shield conductor are smaller than those provided on the shield conductor holding member, and wherein capacitors included in the loop circuits are connected between the rung conductor and the shield conductor through the holes.

2. The magnetic resonance imaging apparatus according to claim 1, wherein a thickness of the inner structure holding member is greater than that of the shield conductor holding member.

3. The magnetic resonance imaging apparatus according to claim 1, wherein the loop circuits are provided with capacitors, and wherein a resonant frequency of the loop circuits is adjusted by the capacitors.

4. A magnetic resonance imaging apparatus comprising:

a cylindrical antenna device that performs at least either one of transmitting or receiving an electromagnetic wave at a certain frequency, wherein, in order from the inside toward the outside in the radial direction of the antenna device, the said antenna device comprises:

a cylindrical inner structure holding member;

a plurality of rung conductors extending to the axial direction of the inner structure holding member;

a cylindrical shield conductor; and a cylindrical shield conductor holding member that holds the shield conductor, wherein, between the inner structure holding member and the shield conductor, spacer members are arranged to form spaces between the rung conductors and the shield conductor, wherein the plurality of rung conductors are arranged at certain intervals along the circumferential direction of the inner structure holding member on the outer circumferential surface of the said inner structure holding member, wherein both ends of the respective rung conductors in the axial direction are electrically connected to the shield conductor so that the said rung conductors and the said shield conductor form loop circuits, wherein at least either one of the shield conductor and the shield conductor holding member or the inner structure holding member is provided with holes in the vicinities where the rung conductors and the shield conductor are electrically connected, wherein each of the loop circuits is dusted so as to resonate at an electromagnetic wave frequency at which the said antenna device performs at least either one of transmission or reception, wherein at least one of the loop circuits is provided with a power supply portion that performs at least either one of transmitting or receiving the electromagnetic wave, wherein the loop circuits are provided with capacitors, wherein a resonant frequency of the loop circuits is adjusted by the capacitors, and wherein the holes have a minimum size to which the capacitors can be connected through the said holes.

5. The magnetic resonance imaging apparatus according to claim 1, wherein the power supply portions are provided for two rung conductors 90 degrees away from the central axis of the antenna device.

6. The magnetic resonance imaging apparatus according to claim 1, wherein the shield conductor is divided into segmental shield conductors, of which the number is equal to or less than that of the plurality of rung conductors, in the circumferential direction of the shield conductor holding member, and wherein the respective loop circuits are provided with the power supply portions.

7. The magnetic resonance imaging apparatus according to claim 1, wherein the antenna device, the inner structure holding member, and the shield conductor holding member have coaxial cylindrical shapes.

8. The magnetic resonance imaging apparatus according to claim 1, wherein the antenna device, the inner structure holding member, and the shield conductor holding member have oval cylindrical shapes that share a long axis and a short axis of the oval.

9. The magnetic resonance imaging apparatus according to claim 3, wherein the rung conductor is divided into a plurality of rung conductor strips in the axial direction, and wherein each of the rung conductor strips is connected to a rung conductor strip adjacent in the axial direction with the capacitor.

10. A magnetic resonance imaging apparatus comprising:

a cylindrical antenna device that performs at least either one of transmitting or receiving an electromagnetic wave at a certain frequency, wherein, in order from the inside toward the outside in the radial direction of the antenna device, the said antenna device comprises:

a cylindrical inner structure holding member;

a plurality of rung conductors extending to the axial direction of the inner structure holding member;

a cylindrical shield conductor; and a cylindrical shield conductor holding member that holds the shield conductor, wherein, between the inner structure holding member and the shield conductor, spacer members are arranged to form spaces between the rung conductors and the shield conductor, wherein the plurality of rung conductors are arranged at certain intervals along the circumferential direction of the inner structure holding member on the outer circumferential surface of the said inner structure holding member, wherein both ends of the respective rung conductors in the axial direction are electrically connected to the shield conductor so that the said rune conductors and the said shield conductor form loop circuits, wherein at least either one of the shield conductor and the shield conductor holding member or the inner structure holding member is provided with holes in the vicinities where the rung conductors and the shield conductor are electrically connected, wherein each of the loop circuits is adjusted so as to resonate at an electromagnetic wave frequency at which the said antenna device performs at least either one of transmission or reception, wherein at least one of the loop circuits is provided with a power supply portion that performs at least either one of transmitting or receiving the electromagnetic wave, wherein the spacer members comprise:
- linear members extending to the axial direction; and
- arc-shaped members extending to the circumferential direction.

11. The magnetic resonance imaging apparatus according to claim 1, wherein the holes are provide on the shield conductor and the shield conductor holding member, and wherein sizes of the holes to be provided on the shield conductor are smaller than those provided on the shield conductor holding member.

* * * * *